United States Patent [19]
Foster et al.

[11] Patent Number: 5,866,213
[45] Date of Patent: Feb. 2, 1999

[54] METHOD FOR PRODUCING THIN FILMS BY LOW TEMPERATURE PLASMA-ENHANCED CHEMICAL VAPOR DEPOSITION USING A ROTATING SUSCEPTOR REACTOR

[75] Inventors: Robert F. Foster, Phoenix; Joseph T. Hillman, Scottsdale, both of Ariz.; Rene E. LeBlanc, East Haven, Conn.

[73] Assignee: Tokyo Electron Limited, Tokyo, Japan

[21] Appl. No.: 899,500

[22] Filed: Jul. 19, 1997

Related U.S. Application Data

[62] Division of Ser. No. 720,621, Oct. 19, 1996, Pat. No. 5,716,870, which is a division of Ser. No. 253,393, Jun. 3, 1994, Pat. No. 5,665,640.

[51] Int. Cl.$^6$ .................................................. B05D 3/06
[52] U.S. Cl. ..................... 427/573; 427/570; 427/255.5
[58] Field of Search ................................... 427/573, 570, 427/569, 575, 255.5

[56] References Cited

U.S. PATENT DOCUMENTS

| | | |
|---|---|---|
| 4,138,306 | 2/1979 | Niwa . |
| 4,151,325 | 4/1979 | Welch . |
| 4,178,877 | 12/1979 | Kudo . |
| 4,282,267 | 8/1981 | Kuyel . |
| 4,352,834 | 10/1982 | Taketoshi et al. . |

(List continued on next page.)

FOREIGN PATENT DOCUMENTS

| | | |
|---|---|---|
| 254 654 A1 | 1/1988 | European Pat. Off. . |
| 359 264 | 3/1990 | European Pat. Off. . |
| 545 460 A2 | 6/1993 | European Pat. Off. . |
| 4016765 | 11/1991 | Germany . |
| 5391664 | 8/1978 | Japan . |
| 60204880 | 10/1985 | Japan . |

(List continued on next page.)

OTHER PUBLICATIONS

Suzuki et al.,, "Planarized Deposition of High–Quality Silicon Dioxide Film by Photoassisted Plasma CVD at 300 C Using Tetraethyl Orthosilicate" 362 Jap J. of Appl. Physics 29 Dec. #12, Tokyo, JP.

Hilton et al., "Comp. Morph & Mech Prop of Plasma–Assisted Chemical Vapor Deposition TiN Films on M2 Tool Steel" Metallurgical & Protective Coatings, Thin Solid Films 139 (1986) 247–260.

Mayr et al., J. Vac. Sci. Technol. A4(6), Nov/Dec. 1986 pp. 2726–2730.

*Primary Examiner*—Roy V. King
*Attorney, Agent, or Firm*—Wood, Herron & Evans, LLP

[57] ABSTRACT

A method for depositing a film on a substrate by plasma-enhanced chemical vapor deposition at temperatures substantially lower than conventional thermal CVD temperatures comprises placing a substrate within a reaction chamber and exciting a first gas upstream of the substrate to generate activated radicals of the first gas. The substrate is rotated within the deposition chamber to create a pumping action which draws the gas mixture of first gas radicals to the substrate surface. A second gas is supplied proximate the substrate to mix with the activated radicals of the first gas and the mixture produces a surface reaction at the substrate to deposit a film. The pumping action draws the gas mixture down to the substrate surface in a laminar flow to reduce recirculation and radical recombination such that a sufficient amount of radicals are available at the substrate surface to take part in the surface reaction. Another method utilizes a gas-dispersing showerhead that is biased with RF energy to form an electrode which generates activated radicals and ions in a concentrated plasma close to the substrate surface. The activated plasma gas radicals and ions utilized in the invention contribute energy to the surface reaction such that the film may be deposited at a substantially lower deposition temperature that is necessary for traditional thermal CVD techniques. Furthermore, the activation of these species reduces the temperature needed to complete the surface reaction. The method is particularly useful in depositing titanium-containing films at low temperatures.

13 Claims, 9 Drawing Sheets

U.S. PATENT DOCUMENTS

| | | |
|---|---|---|
| 4,365,587 | 12/1982 | Hirose et al. . |
| 4,366,208 | 12/1982 | Akai et al. . |
| 4,410,758 | 10/1983 | Grolitzer . |
| 4,504,518 | 3/1985 | Ovshinsky et al. . |
| 4,532,199 | 7/1985 | Ueno et al. . |
| 4,535,000 | 8/1985 | Gordon . |
| 4,557,943 | 12/1985 | Rosler et al. . |
| 4,657,774 | 4/1987 | Satou et al. . |
| 4,678,679 | 7/1987 | Ovshinsky . |
| 4,689,093 | 8/1987 | Isihara et al. . |
| 4,702,934 | 10/1987 | Ishihara et al. . |
| 4,716,048 | 12/1987 | Ishihara et al. . |
| 4,717,584 | 1/1988 | Aoki et al. . |
| 4,717,585 | 1/1988 | Ishihara et al. . |
| 4,717,586 | 1/1988 | Ishihara et al. . |
| 4,718,976 | 1/1988 | Fujimura . |
| 4,726,963 | 2/1988 | Ishihara et al. . |
| 4,728,528 | 3/1988 | Ishihara et al. . |
| 4,759,947 | 7/1988 | Ishihara et al. . |
| 4,772,486 | 9/1988 | Ishihara et al. . |
| 4,774,195 | 9/1988 | Beneking . |
| 4,778,692 | 10/1988 | Ishihara et al. . |
| 4,784,874 | 11/1988 | Ishihara et al. . |
| 4,792,378 | 12/1988 | Rose et al. . |
| 4,798,165 | 1/1989 | deBoer et al. . |
| 4,801,468 | 1/1989 | Ishihara et al. . |
| 4,803,093 | 2/1989 | Ishihara et al. . |
| 4,818,560 | 4/1989 | Ishihara et al. . |
| 4,818,563 | 4/1989 | Ishihara et al. . |
| 4,835,005 | 5/1989 | Hirooka et al. . |
| 4,844,950 | 7/1989 | Saitoh et al. . |
| 4,851,302 | 7/1989 | Nakagawa et al. . |
| 4,853,251 | 8/1989 | Ishihara et al. . |
| 4,854,263 | 8/1989 | Chang et al. ........................... 118/715 |
| 4,869,923 | 9/1989 | Yamazaki . |
| 4,869,924 | 9/1989 | Ito . |
| 4,870,030 | 9/1989 | Markunas et al. . |
| 4,876,983 | 10/1989 | Fukuda et al. . |
| 4,885,067 | 12/1989 | Doty . |
| 4,886,683 | 12/1989 | Hoke et al. . |
| 4,888,062 | 12/1989 | Nakagawa et al. . |
| 4,888,088 | 12/1989 | Slomowitz . |
| 4,897,709 | 1/1990 | Yokoyama et al. . |
| 4,898,118 | 2/1990 | Murakami et al. . |
| 4,900,694 | 2/1990 | Nakagawa . |
| 4,908,329 | 3/1990 | Kanai et al. . |
| 4,908,330 | 3/1990 | Arai et al. . |
| 4,913,929 | 4/1990 | Moslehi et al. . |
| 4,914,052 | 4/1990 | Kanai . |
| 4,926,229 | 5/1990 | Nakagawa et al. . |
| 4,927,786 | 5/1990 | Nishida . |
| 4,937,094 | 6/1990 | Doehler et al. . |
| 4,946,514 | 8/1990 | Nakagawa et al. . |
| 4,951,602 | 8/1990 | Kanai . |
| 4,954,397 | 9/1990 | Amada et al. . |
| 4,957,772 | 9/1990 | Saitoh et al. . |
| 4,959,106 | 9/1990 | Nakagawa et al. . |
| 4,971,832 | 11/1990 | Arai et al. . |
| 4,977,106 | 12/1990 | Smith . |
| 4,987,856 | 1/1991 | Hey et al. . |
| 4,992,305 | 2/1991 | Erbil . |
| 4,992,839 | 2/1991 | Shirai . |
| 4,998,503 | 3/1991 | Murakami et al. . |
| 5,000,113 | 3/1991 | Wang et al. . |
| 5,002,617 | 3/1991 | Kanai et al. . |
| 5,002,793 | 3/1991 | Arai . |
| 5,002,796 | 3/1991 | Nishida . |
| 5,006,180 | 4/1991 | Kanai et al. . |
| 5,007,971 | 4/1991 | Kanai et al. . |
| 5,008,726 | 4/1991 | Nakagawa et al. . |
| 5,010,842 | 4/1991 | Oda et al. . |
| 5,018,479 | 5/1991 | Markunas et al. . |
| 5,024,706 | 6/1991 | Kanai et al. . |
| 5,028,488 | 7/1991 | Nakagawa et al. . |
| 5,030,475 | 7/1991 | Ackermann et al. . |
| 5,037,666 | 8/1991 | Mori . |
| 5,039,354 | 8/1991 | Nakagawa et al. . |
| 5,061,511 | 10/1991 | Saitoh et al. . |
| 5,073,232 | 12/1991 | Ohmi et al. . |
| 5,085,885 | 2/1992 | Foley et al. . |
| 5,087,542 | 2/1992 | Yamazaki et al. . |
| 5,093,149 | 3/1992 | Doehler et al. . |
| 5,093,150 | 3/1992 | Someno et al. . |
| 5,100,495 | 3/1992 | Ohmi et al. . |
| 5,122,431 | 6/1992 | Kodama et al. . |
| 5,126,169 | 6/1992 | Ishihara et al. . |
| 5,130,170 | 7/1992 | Kanai et al. . |
| 5,139,825 | 8/1992 | Gordon et al. . |
| 5,151,296 | 9/1992 | Tokunaga . |
| 5,154,135 | 10/1992 | Ishihara . |
| 5,173,327 | 12/1992 | Sandhu et al. . |
| 5,175,017 | 12/1992 | Kobayashi et al. . |
| 5,178,904 | 1/1993 | Ishihara et al. . |
| 5,178,905 | 1/1993 | Kanai et al. . |
| 5,180,435 | 1/1993 | Markunas et al. . |
| 5,192,370 | 3/1993 | Oda . |
| 5,213,997 | 5/1993 | Ishihara et al. . |
| 5,220,181 | 6/1993 | Kanai et al. . |
| 5,246,881 | 9/1993 | Sandhu et al. . |
| 5,260,236 | 11/1993 | Petro et al. . |
| 5,268,034 | 12/1993 | Vukelic . |
| 5,279,857 | 1/1994 | Eichman et al. . |
| 5,308,655 | 5/1994 | Eichman et al. . |
| 5,318,654 | 6/1994 | Maruyama . |
| 5,342,652 | 8/1994 | Foster et al. . |
| 5,356,476 | 10/1994 | Foster et al. . |
| 5,370,739 | 12/1994 | Foster et al. . |
| 5,378,501 | 1/1995 | Foster et al. . |
| 5,396,404 | 3/1995 | Akahori et al. . |
| 5,416,045 | 5/1995 | Kauffman et al. . |
| 5,433,787 | 7/1995 | Suzuki et al. . |
| 5,434,110 | 7/1995 | Foster et al. . |
| 5,443,647 | 8/1995 | Aucoin . |

FOREIGN PATENT DOCUMENTS

| | | |
|---|---|---|
| 61417630 | 2/1986 | Japan . |
| 2085368 | 3/1990 | Japan . |
| 2-217475 | 8/1990 | Japan . |
| 6-158320 | 6/1994 | Japan . |
| 2182458 | 4/1987 | United Kingdom . |
| 2245600 | 1/1992 | United Kingdom . |
| WO93/25722 | 12/1993 | WIPO . |

METHOD FOR PRODUCING THIN FILMS BY LOW TEMPERATURE PLASMA-ENHANCED CHEMICAL VAPOR DEPOSITION USING A ROTATING SUSCEPTOR REACTOR

This application is a divisional of application Ser. No. 08/720,621 filed on Oct. 2, 1996, entitled METHOD FOR PRODUCING THIN FILMS BY LOW TEMPERATURE PLASMA-ENHANCED CHEMICAL VAPOR DEPOSITION USING A ROTATING SUSCEPTOR REACTOR, now U.S. Pat. No. 5,716,870, which application is, in turn, a divisional of application Ser. No. 08/253,393 filed on Jun. 3, 1994, of Robert F. Foster et al., entitled METHOD AND APPARATUS FOR PRODUCING THIN FILMS BY LOW TEMPERATURE PLASMA-ENHANCED CHEMICAL VAPOR DEPOSITION USING A ROTATING SUSCEPTOR REACTOR, now U.S. Pat. No. 5,665,640, which applications are completely incorporated herein by reference in their entireties.

FIELD OF THE INVENTION

This invention relates generally to plasma-enhanced chemical vapor deposition (PECVD) for applying a film coating to a substrate, and more specifically to PECVD conducted at a low effective deposition temperature at the substrate surface. Even more specifically, the invention relates to deposition of titanium-containing films using low temperature CVD.

BACKGROUND OF THE INVENTION

In the formation of integrated circuits (IC's), thin films containing metal and metalloid elements are often deposited upon the surface of a substrate, such as a semiconductor wafer. Thin films are deposited to provide conductive and ohmic contacts in the circuits and between the various devices of an IC. For example, a desired thin film might be applied to the exposed surface of a contact or via hole on a semiconductor wafer, with the film passing through the insulative layers on the wafer to provide plugs of conductive material for the purpose of making interconnections across the insulating layers.

One well known process for depositing thin metal films is chemical vapor deposition (CVD) in which a thin film is deposited using chemical reactions between various deposition or reactant gases at the surface of the substrate. In CVD, reactant gases are pumped into proximity to a substrate inside a reaction chamber, and the gases subsequently react at the substrate surface resulting in one or more reaction by-products which form a film on the substrate surface. Any by-products remaining after the deposition are removed from the chamber. While CVD is a useful technique for depositing films, many of the traditional CVD processes are basically thermal processes and require temperatures in excess of 1000° C. in order to obtain the necessary reactions. Such a deposition temperature is often far too high to be practically useful in IC fabrication due to the effects that high temperatures have on various other aspects and layers of the electrical devices making up the IC.

Particularly, certain aspects of IC components are degraded by exposure to the high temperatures normally related to traditional thermal CVD processes. For example, at the device level of an IC, there are shallow diffusions of semiconductor dopants which form the junctions of the electrical devices within the IC. The dopants are often initially diffused using heat during a diffusion step, and therefore, the dopants will continue to diffuse when the IC is subjected to a high temperature during CVD. Such further diffusion is undesirable because it causes the junction of the device to shift, and thus alters the resulting electrical characteristics of the IC. Therefore, for certain IC devices, exposing the substrate to processing temperatures of above 800° C. is avoided, and the upper temperature limit may be as low as 650° C. for other more temperature sensitive devices.

Furthermore, such temperature limitations may become even more severe if thermal CVD is performed after metal interconnection or wiring has been applied to the IC. For example, many IC's utilize aluminum as an interconnection metal. However, various undesirable voids and extrusions occur in aluminum when it is subjected to high processing temperatures. Therefore, once interconnecting aluminum has been deposited onto an IC, the maximum temperature to which it can be exposed is approximately 500° C., and the preferred upper temperature limit is 400° C. Therefore, as may be appreciated, it is desirable during CVD processes to maintain low deposition temperatures whenever possible.

Consequently, the upper temperature limit to which a substrate must be exposed precludes the use of some traditional thermal CVD processes which might otherwise be very useful in fabricating IC's. A good example of one such useful process is the chemical vapor deposition of titanium. Titanium is typically used to provide ohmic contact between the silicon contacts of an IC device and a metal interconnection. Titanium may be deposited from $TiBr_4$, $TiCl_4$ or $TiI_4$ by using CVD methods such as unimolecular pyrolysis or hydrogen reduction. However, the temperatures necessary for these thermal processes are in excess of 1000° C., and such a deposition temperature is much to high to be practically useful in IC fabrication. Therefore, the deposition of titanium and titanium-containing films presents a problem in formation of integrated circuits.

There are low temperature physical techniques available for depositing titanium on temperature sensitive substrates. Sputtering is one such technique involving the use of a target of layer material and an ionized plasma. To sputter deposit a film, the target is electrically biased and ions from the plasma are attracted to the target to bombard the target and dislodge target material particles. The particles then deposit them selves cumulatively as a film upon the substrate. Titanium may be sputtered, for example, over a silicon substrate after various contacts or via openings are cut into a level of the substrate. The substrate might then be heated to about 800° C. to allow the silicon and titanium to alloy and form a layer of titanium silicide ($TiSi_2$). After the deposition of the titanium layer, the excess titanium is etched away from the top surface of the substrate leaving $TiSi_2$ at the bottom of each contact or via. A metal interconnection is then deposited directly over the $TiSi_2$.

While physical sputtering provides deposition of a titanium film at a lower temperature, sputtering processes have various drawbacks. Sputtering normally yields very poor step coverage. Step coverage is defined as the ratio of film thickness on the bottom of a contact on a substrate wafer to the film thickness on the sides of the contact or the top surface of the substrate. Consequently, to sputter deposit a predetermined amount of titanium at the bottom of a contact or via, a larger amount of the sputtered titanium must be deposited on the top surface of the substrate or the sides of the contact. For example, in order to deposit a 200 Å film at the bottom of a contact using sputtering, a 600 Å to 1000 Å film layer may have to be deposited onto the top surface of t he substrate or the sides of the contact. Since the excess titanium has to be etched away, sputtering is wasteful and costly when depositing layers containing titanium.

Furthermore, the step coverage of the contact with sputtering techniques decreases as the aspect ratio of the contact or via increases. The aspect ratio of a contact is defined as the ratio of contact depth to the width of the contact. Therefore, a thicker sputtered film must be deposited on the top or sides of a contact that is narrow and deep (high aspect ratio) in order to obtain a particular film thickness at the bottom of the contact than would be necessary with a shallow and wide contact (low aspect ratio). In other words, for smaller device dimensions in an IC, corresponding to high aspect ratio contacts and vias, sputtering is even more inefficient and wasteful. The decreased step coverage during sputter deposition over smaller devices results in an increased amount of titanium that must be deposited, thus increasing the amount of titanium applied and etched away, increasing the titanium deposition time, and increasing the etching time that is necessary to remove excess titanium. Accordingly, as IC device geometries continue to shrink and aspect ratios increase, deposition of titanium-containing layers by sputtering becomes very costly.

On the other hand, using a CVD process for depositing a titanium-containing film layer may be accomplished with nearly 100% step coverage. That is, the film thickness at the bottom of the contact would approximately equal the thickness on the top surface almost regardless of the aspect ratio of the contact or via being filled. However, as discussed above, the temperatures necessary for such CVD processes are too high and would degrade other aspects of the IC. Consequently, it would be desirable to achieve titanium CVD at a temperature less than 800° C., and preferably less than 650° C. Further, it is generally desirable to reduce the deposition temperature for any CVD process which is utilized to deposit a film in IC fabrication.

One approach which has been utilized in CVD processes to lower the reaction temperature is to ionize one or more of the reactant gases. Such a technique is generally referred to as plasma enhanced chemical vapor deposition (PECVD). While it has been possible with such an approach to somewhat lower the deposition temperatures, the high sticking coefficient of the ionized plasma particles degrades the step coverage of the film. That is, ions of the reactant gases are highly reactive and have a tendency to contact and stick to the walls of the vias or contacts in the substrate. The ion particles do not migrate downwardly to the bottom surface of the contact where the coating is desired but rather non-conformally coat the sides of the contact. This results in increased material usage, deposition times and etch times. Therefore, PECVD using ionized reactant gases has not been a completely adequate solution to lowering traditional high CVD temperatures and achieving good step coverage and film conformality.

Additionally, when using a CVD process to apply a film, it is desirable to uniformly deposit the film. To do so, such as to apply a uniform film of tungsten (W), for example, a uniform supply of reactant gases must be supplied across the surface of the substrate and the spent gases and reaction by-products should be removed from the surface being coated. In this respect, prior art CVD processes have again performed with limited success. Specifically, in known CVD processes, turbulence in the flow of reaction gases inhibits the efficiency and uniformity of the coating process and aggravates the deposition and migration of contaminants within the reaction chamber. In tungsten CVD processes, tungsten hexafluoride ($WF_6$) is employed as a reactant gas. Tungsten hexafluoride is very costly and thus, when reactant gas utilization efficiency is low, as it is in prior art CVD processes, the overall process costs are significantly increased. Accordingly, there is a need for CVD processes which have improved gas flow and reduced gas flow turbulence to more efficiently and more uniformly supply reaction gases to and remove reaction by-products from the surfaces of the substrate being coated.

Therefore, CVD processes which may be accomplished at lower effective temperatures are desired. It is further desirable to have a low temperature deposition which provides good step coverage. It is still further desirable to have a PECVD process which produces uniform film thickness and effective utilization of reactant gases. Accordingly, the present invention addresses these objectives and the shortcomings of the various CVD and PECVD processes currently available. Further, the present invention, particularly addresses the difficulties associated with depositing titanium and titanium-containing films using CVD.

SUMMARY OF THE INVENTION

The CVD apparatuses and methods of the present invention overcome or obviate the high temperature and gas flow drawbacks associated with many of the currently available thermal CVD and PECVD apparatuses and processes. Specifically, the present invention achieves deposition of a titanium-containing film at a substantially lower temperature as compared to traditional thermal CVD processes. Further, in doing so, the invention does not compromise the conformality of the resulting film layer, and makes efficient use of the activated and reactant gases while reducing gas turbulence at the substrate surface.

The low temperature deposition of the present invention is accomplished in two alternative methods. The first method utilizes the upstream, remote generation of a plasma. The plasma is pumped down to a substrate by a rotating susceptor and is extinguished as it travels to the substrate, so that predominantly activated gas radicals are present. The gas radicals combine with unexcited reactant gases to deposit a film layer on the substrate by CVD techniques. The pumping of the rotating susceptor minimizes gas particle recirculations and collisions to yield a useful percentage of radicals.

The second method utilizes an RF showerhead design which yields a concentrated plasma very close to the substrate surface. All of the gases, both plasma and reactant gases, are passed through the RF showerhead electrode and are excited. Since the susceptor acts as another electrode, the RF showerhead and the susceptor form a parallel plate electrode configuration. With the RF electrode method, the plasma gases utilized in the chemical vapor deposition at the substrate contains a mixture of both ions and radicals which contribute energy to the surface reaction.

More specifically, one CVD process of the present invention utilizes a plasma source to generate, upstream of a substrate wafer, a gas plasma containing various excited particles of the gas, including charged ions and excited, charge-neutral radicals, as well as free electrons. The excited particles of the plasma gas, and predominantly the excited radical particles are brought to the surface before they have had a chance to combine to form neutral molecules. The excited radicals chemically react with one or more reactant gases to form a thin film on a substrate. The excited radicals supply energy to the surface reaction such that CVD may be used in accordance with the principles of the present invention at temperatures substantially lower than those required with traditional CVD methods.

To prevent the particle sticking and the reduced layer conformality associated with traditional PECVD using ionized particles, the upstream method of the present invention utilizes predominantly charge-neutral, activated radicals at the substrate surface which yield conformal, uniform films. However, the lifetime of such activated gas radicals is short as they seek to recombine into a low energy, stable molecular structure. As mentioned above, the present invention provides efficient use of the activated gas radicals by bringing the radicals to the substrate surface before a significant number of them are able to recombine to form the original, stable gas molecules. For efficient delivery of the radicals, the present invention utilizes a rotating susceptor which supports and rotates the substrate and creates a downward pumping action in the direction of the substrate. The rotating susceptor pumps the radicals to the substrate surface.

A reactant gas or gases are introduced into the deposition region above the substrate surface to mix with the activated gas radicals. The downward pumping action of the rotating susceptor simultaneously draws the mixture of radicals and reactant gases toward the substrate surface. At the substrate surface, the mixture of radicals and reactant gases flows radially outward from the center of the substrate in a substantially uniform laminar flow pattern and the excited radicals react with the reactant gas particles in a surface reaction which results in a film layer being deposited upon the substrate surface.

The activated radicals supply energy to the surface reaction and thereby reduce the required energy, such as thermal energy, that is necessary for the chemical reaction to take place at the substrate surface. Therefore, the deposition takes place at a substantially lower temperature than the temperature required by traditional CVD processes. For example, the deposition of a titanium-containing layer using the present invention may be accomplished at 600° C. or below versus 1000° C. for some traditional thermal CVD processes.

The unique pumping action and laminar flow of gases created by the rotating susceptor ensures a useful density of radicals at the substrate surface. For example, by using a gas flow of between 500 to 50,000 sccm (standard cubic centimeters per minute), a susceptor rotation-rate of 0 to 1,000 rpm, a reaction chamber pressure between 0.5 and 10 Torr, and a reactant gas flow rate between 1 to 20 sccm, the present invention has yielded thin films from CVD techniques at temperatures below 650° C. The upstream plasma may be excited using either an RF signal or a microwave signal. Accordingly, the invention has been found to yield desirable results when the plasma is excited at frequencies as high as 2.54 GHz and as low as 13.56 kHz.

The laminar pattern created by the rotating susceptor minimizes gas particle recirculations and subsequent radical recombinations at the substrate surface, and therefore, there are more activated radicals available at the substrate surface for the low temperature CVD process. Additionally, in the method of the present invention, increasing the rotation rate of the susceptor increases the deposition rate at the substrate surface. Due to the unique combination of activated radicals and the laminar flow produced by the pumping action of the rotating susceptor, the deposition rate of the present invention increases beyond what might be achieved solely due to the increase in molecular reactants at the substrate surface resulting from an increased pumping action. That is, increasing the rotation rate of the susceptor accomplishes more than merely drawing reactant gases toward the substrate at a higher rate; it further minimizes recombination of radicals thus providing more available radicals at the substrate surface. This enhancement in the delivery of radicals to the substrate surface is an important advancement in PECVD processes. It allows the majority of the radicals formed upstream or remotely from the substrate to be carried to the substrate surface so that they take place in the surface deposition reaction without a large amount of radical recombination loss. This enhancement and the subsequent increased energy at the surface reaction, in turn, allows the reaction to take place at even lower deposition temperatures.

For the RF electrode plasma generation method of the present invention, the plasma gas is delivered proximate the surface of the substrate utilizing a gas-dispersing showerhead which is biased with RF energy to act as an electrode. A susceptor supporting a substrate acts as another parallel electrode. The RF showerhead/electrode generates a concentrated plasma very close to the surface of the substrate while a gas delivery cylinder attached to the showerhead ensures uniform gas flow to the plasma. The proximity of the plasma to the substrate ensures an ample density of activated radicals and ions for the surface reaction. That is, a combination of both gas radicals and gas ions is utilized in the RF showerhead/electrode method. Utilizing the showerhead/electrode, a spacing of less than 1" between the generated plasma and the substrate is possible yielding desirable CVD films. Furthermore, the RF showerhead/electrode method keeps the plasma concentrated below the showerhead and close to the substrate for efficient deposition. The RF showerhead has been utilized at RF frequencies from 13.56 MHZ to as low as 450 KHz.

While the present invention may be utilized with a number of different plasma gases and reactant gases, the invention has been found to be particularly useful for depositing titanium-containing films, such as pure titanium (Ti), titanium nitride (TiN) and/or titanium silicide ($TiSi_2$) films onto a substrate utilizing plasma containing radicals and ions of hydrogen and nitrogen and/or disassociated titanium tetrachloride ($TiCl_4$) and ammonia ($NH_3$). A diluent such as argon might be mixed with the plasma gas. Further, different plasma gases besides $H_2$, $N_2$ and $NH_3$ might be used in accordance with the principles of the present invention to supply radicals and ions to the surface reaction according to the present invention.

In a specific embodiment, the invention has been found useful for depositing titanium films over aluminum layers on a substrate. Deposition temperatures in accordance with the invention are low enough that the aluminum layer is not damaged by reflow during the deposition.

In another specific embodiment, the invention has been found useful for producing selective deposition of titanium over a substrate having a field oxide (silicon oxide) layer patterned with vias into a lower silicon layer. Under certain conditions, it has been found that titanium deposits only on the silicon layers in the vias without significant deposition on the field oxide.

In accordance with various hardware embodiments of the invention, the plasma may be created using energy from various energy sources including microwave and radio frequency (RF) sources. One hardware embodiment utilizes a showerhead/electrode which is biased with RF energy to create a plasma. One possible upstream plasma embodiment utilizes a commercially available plasma source with an RF coil surrounding a plasma region. Still another embodiment utilizes an upstream microwave plasma source which remotely excites a plasma with microwave energy. The remote plasma is then pumped along a tube whereby activated radicals are formed. After exiting the tube and entering the deposition chamber, the radicals are mixed with reactant gases and drawn to the substrate surface by the rotating susceptor.

The invention and the particular advantages and features of the present invention will now be described in detail below with reference to the accompanying drawings.

DETAILED DESCRIPTION OF THE INVENTION

The present invention includes both methods and apparatuses for accomplishing low temperature CVD utilizing activated gas radicals and/or activated gas radicals and ions. Proper use of the activated ions and radicals, and a resultant low temperature CVD method, requires a useful density of radicals and/or ions at the substrate surface. A rotating susceptor is used in accordance with the present invention which rotates a substrate inside of a deposition chamber and draws activated gas radicals down to the surface of the substrate. The radicals and reactant gases take part in a surface reaction on the substrate to deposit a film. The activated, charge-neutral radicals and charged ions contribute energy to the surface reaction such that the film is deposited upon the substrate surface in a chemical vapor technique at substantially lower temperatures than are possible with thermal CVD techniques. Also, because the ions and radicals are activated by the plasma, less thermal energy is required to complete the surface reaction.

Preferably, in the upstream plasma generation, predominantly radicals are present at the substrate surface to participate in the low temperature surface reaction. The laminar gas flow created by the susceptor reduces collisions and the subsequent recombinations of the activated radicals into stable molecules so that a useful density of the radicals are delivered to the substrate surface to take place in the surface reaction and subsequent film formation. With the RF showerhead/electrode method, the plasma may be generated very close to the substrate, as discussed further hereinbelow, thus enhancing the efficient use of the activated ions and radicals. The present invention yields a CVD technique that may be accomplished at very low temperatures compared with the traditional thermal CVD techniques thus making it practical for integrated circuit fabrication requiring low deposition temperatures. Furthermore, the inventive method achieves improved step coverage and film conformality over sputter deposition techniques and other CVD techniques. The invention may be utilized to deposit various different films by a low temperature CVD; however, it is particularly useful in depositing titanium-containing films such as titanium nitride (TiN) at low temperatures and especially pure titanium metal.

Figure 1:
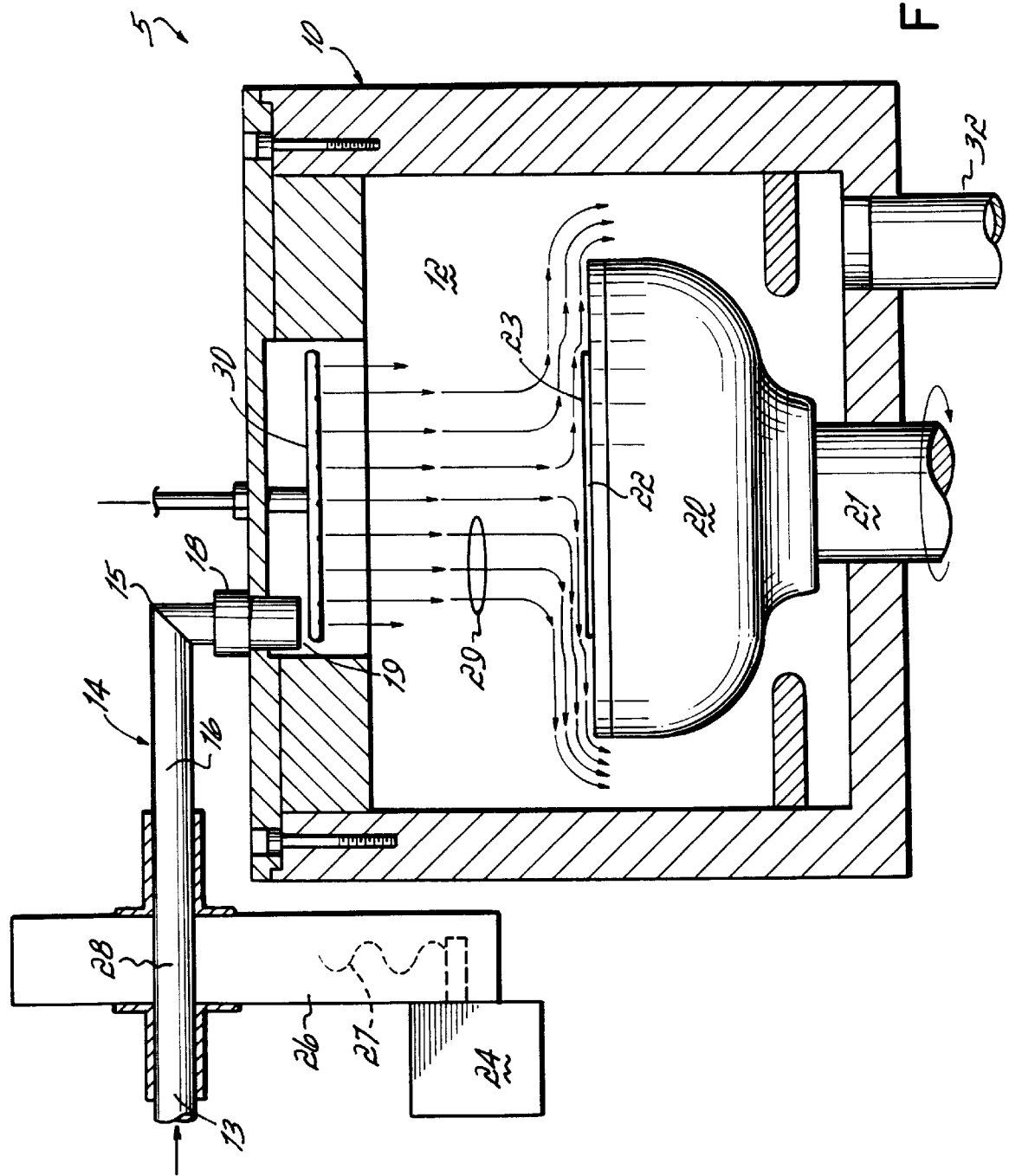
FIG. 1 is a side view and partial cross-section of one embodiment of an upstream plasma-enhanced deposition chamber used to practice the methods of the present invention using microwave energy.

FIG. 1 shows one embodiment of an upstream plasma source with a rotating susceptor for practicing the upstream plasma-enhanced CVD of the present invention. The embodiment of FIG. 1 utilizes a microwave plasma source for generating an upstream reactant gas plasma from which the necessary activated radicals are drawn. A reactor 5 includes a chamber housing 10 enclosing a reaction space 12. The housing 10 may be controllably vacuumed to a desired internal deposition pressure for practicing the invention. Plasma gases to be excited, such as, for example, hydrogen gas ($H_2$), nitrogen gas ($N_2$), and/or ammonia ($NH_3$) are introduced into space 12 through a quartz tube 14. Plasma tube 14 is L-shaped and has a long portion 16 which extends generally horizontally until it reaches a 90° bend 15. After the 90° bend 15, a small straight section 18 extends vertically downward and has an outlet end 19 which opens into space 12. Housing 10 also contains a rotating susceptor 20 which rotates on a shaft 21 coupled to a motor (not shown), such that the speed of the rotation may be adjusted. Susceptor 20 supports a substrate 22 in the reaction space 10. A temperature control device (not shown) is coupled to susceptor 20 which is used to heat substrate 22 to the desired temperature. An example of a suitable reactor, including a rotating susceptor, for practicing the methods of the invention is the Rotating Disk Reactor available from Materials Research Corporation (MRC) of Phoenix, Ariz.

A microwave energy source 24 is coupled to plasma tube 14 through a microwave waveguide 26. The waveguide 26 propagates microwave energy 27 from source 24 to tube 14 to define an excitation region 28 within the tube 14. Plasma gases are introduced into tube 14 at end 13 and travel along the length of the tube 14 passing through region 28, wherein the microwave energy 22 is absorbed by the gases to excite the gases to form a plasma. The plasma generated in tube 14 contains various activated particles including ions and activated, charge-neutral radicals. For example, if hydrogen gas ($H_2$) is introduced into tube 14, a hydrogen plasma containing free electrons ($e^-$), hydrogen ions ($H^+$) and charge-neutral, activated hydrogen radicals ($H^*$) is produced, while nitrogen gas ($N_2$) yields electrons, nitrogen ions ($N^-$) and activated radicals ($N^*$). Ammonia gas ($NH_3$) might also be utilized to produce radicals of hydrogen $H^*$ and nitrogen $N^*$. However, as discussed in greater detail below, $NH_3$ reacts with some reactant gases, such as ($TiCl_4$), to form an undesired adduct. Therefore, preferably pure $H_2$ and/or $N_2$ are excited and utilized to achieve low temperature CVD.

Utilizing hydrogen ($H_2$) as the plasma gas, generation of the plasma results in generation of radicals $H^*$ as well as ionization as follows:

$$H_2 \rightarrow 2H^+ + 2e^- \text{ (ionization)} \tag{EQ 1}$$

As the excited gas plasma travels along the horizontal section of tube 34, recombination occurs according to equation 2 below as the plasma is extinguished, and additional hydrogen radicals H* are created through a combination of hydrogen ions and free electrons.

$$H^+ + e^- \rightarrow H^* \text{ (recombination)} \quad \text{(EQ 2)}$$

As time progresses, a second recombination may occur according to equation 3. The second recombination yields inactive, stable hydrogen gas molecules which will not contribute reaction energy to the surface reaction. Therefore, it is important to deliver the activated radicals to a surface 23 of substrate 22 before they recombine.

$$H^* + H^* \rightarrow H_2 \quad \text{(EQ 3)}$$

The hydrogen radicals H* and any other remaining gas particles of the plasma travel around the 90° bend 15 of the tube 14 and are drawn downwardly along vertical section 18 and out into the reaction space 12 through outlet 19 by the rotation of susceptor 20. Rotating susceptor 20 generates a downward pumping action in the direction of substrate 22. The pumping action creates a laminar flow of gases over the wafer surface 23 as illustrated by arrows 29.

Preferably, susceptor 20 is operated to achieve matched gas flow conditions. In a matched gas flow, the rate of gas flow in a downward direction indicated by Q-1 equals the rate of gas flow in a horizontal direction designated by Q-2. When these two gas flow rates are equal, matched flow occurs. An additional discussion of matched flow is disclosed in the application entitled "A Method For Chemical Vapor Deposition Of Titanium-Nitride Films At Low Temperatures", Ser. No. 08/131,900, filed Oct. 5, 1993, now U.S. Pat. No. 5,378,501, which application is incorporated herein by reference.

For an efficient CVD reaction according to the principles of the present invention, it is desirable that the plasma gas reaching the substrate 22 contain a large percentage of radicals, and preferably 80% or more activated radicals by composition. Such a high radical composition requires drawing the plasma gas down to the substrate 22 with minimal recombinations. Maximum utilization of radicals is accomplished by the laminar flow created by the rotating susceptor 20. It has been determined through experimentation that the laminar flow pattern of the susceptor 20 minimizes the recirculations of the gas reactants and particularly minimizes recirculation of the activated gas radicals at the substrate surface 23. The minimized recirculation, in turn, minimizes gas phase collisions of the activated radicals, and hence, reduces the rate at which the radicals recombine to form stable molecules. That is, the amount of recombination of H* into $H_2$ according to equation 3 above is reduced. As a result, there is a greater density of useful activated radicals available at the substrate surface 23 to supply energy to the chemical surface reaction and to reduce the thermal energy required in the chemical vapor deposition of the film. Thereby, the present invention effectively reduces the deposition temperature.

When gas radicals are introduced into space 12, the reactant gases are introduced such as through a vertically adjustable showerhead 30 shown in FIG. 1. For example, to deposit a titanium-containing film, a titanium tetrahalide gas such as titanium tetrachloride ($TiCl_4$), titanium tetrabromide ($TiBr_4$), or titanium tetraiodide ($TiI_4$), and preferably $TiCl_4$, is introduced. For a pure titanium layer, $H_2$ might be excited into a plasma and $TiCl_4$ might be introduced into the reaction space 12. A mixture of H* and $TiCl_4$ might then occur in space 12 generally above susceptor 20 and substrate 22. The pumping action of susceptor 20 would draw the mixture down to substrate surface 23 in a laminar flow and the activated H* and $TiCl_4$ should react at surface 23 to deposit a thin film on the substrate 22. Hydrogen radicals H* should supply energy to the surface reaction according to equation 4.

$$4H^* + TiCl_4 \rightarrow Ti + 4HCl \quad \text{(EQ 4)}$$

The reaction should yield a film of titanium (Ti) upon the substrate surface 23 and hydrochloric acid (HCl) which might be removed through the appropriate exhaust port 32. The energy contributed to the reaction of equation 4 by the activated radicals should achieve a CVD film at reduced deposition temperatures.

While the example of the invention described hereinabove might yield a layer of pure titanium upon the substrate 22, various other material layers might also be deposited according to the principles of the present invention containing titanium or containing other desirable elements. For example, titanium nitride (TiN) might be deposited by introducing hydrogen ($H_2$) and nitrogen ($N_2$) into the plasma-generating tube 14 to yield H* and N* radicals. Further, ammonia gas ($Nh_3$) may be excited and disassociated into a plasma containing H* and N* radicals. Similar to the recombination of the hydrogen gas plasma particles, the N* radicals will eventually combine into nitrogen molecules ($N_2$) unless quickly drawn down to the surface of the substrate 23. As a further example, titanium silicide ($TiSi_2$) might also be deposited according to the principles of the present invention. In such a case, silane gas ($SiH_4$) might be introduced with the titanium-containing gas (e.g. $TiCl_4$) into the reaction space 12. Additionally, tungsten (W) may be deposited using the apparatus of FIG. 1 and the method described. Examples of chemical reactions for producing titanium nitride and titanium silicide are given below in equations 5 and 6, respectively.

$$TiCl_4 + N^* + 4H^* \rightarrow TiN + 4HCl \quad \text{(EQ 5)}$$

$$TiCl_4 + 2SiH_4 + 4H^* \rightarrow TiSi_2 + 4HCl + 4H_2 \quad \text{(EQ 6)}$$

The microwave plasma deposition apparatus of FIG. 1 was used to deposit a layer of tungsten and several tests were made to determine the viability of the method. Hydrogen was passed through quartz tube 14. An excited plasma was ignited in the vicinity of region 28 and traveled downstream through tube 14 into reaction space 12. As the plasma traveled along quartz tube 14, it was extinguished downstream of the microwave excitation region 28 indicating that recombination of the excited plasma particles had occurred, such as according to equation 2 above to yield additional hydrogen radicals. The hydrogen radicals were subsequently drawn down to substrate surface 23 by rotating susceptor 20. Simultaneously, tungsten hexafluoride ($WF_6$) was introduced through a gas port 29. A deposition reaction occurred according to Equation 7, below, to deposit a layer of tungsten onto substrate 22.

$$WF_6 + 6H^* \rightarrow W + 6HF \quad \text{(EQ 7)}$$

Figure 4A:
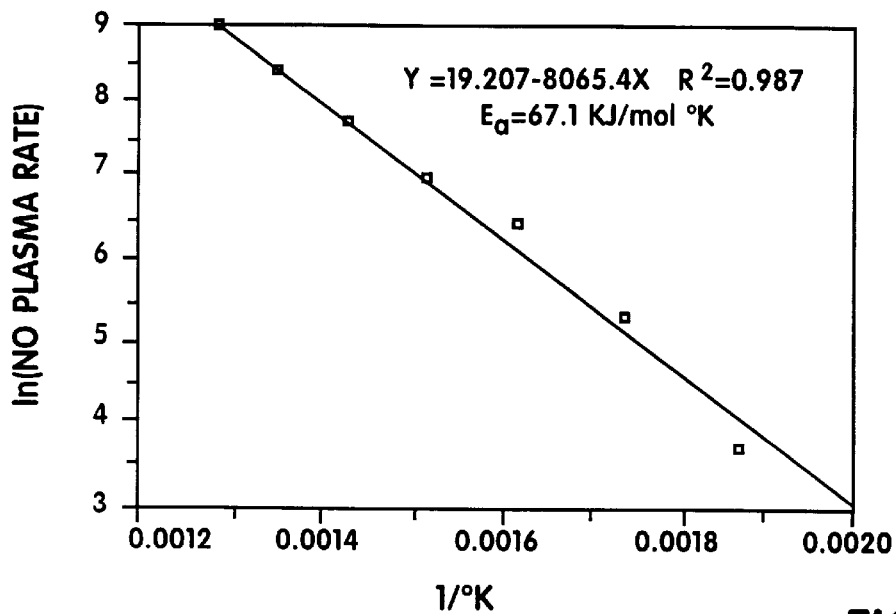
FIGS. 4A and 4B are Arrhenius function graphs of the necessary activation energy for deposition with and without the upstream activated radicals of the present invention, respectively.
Figure 4B:
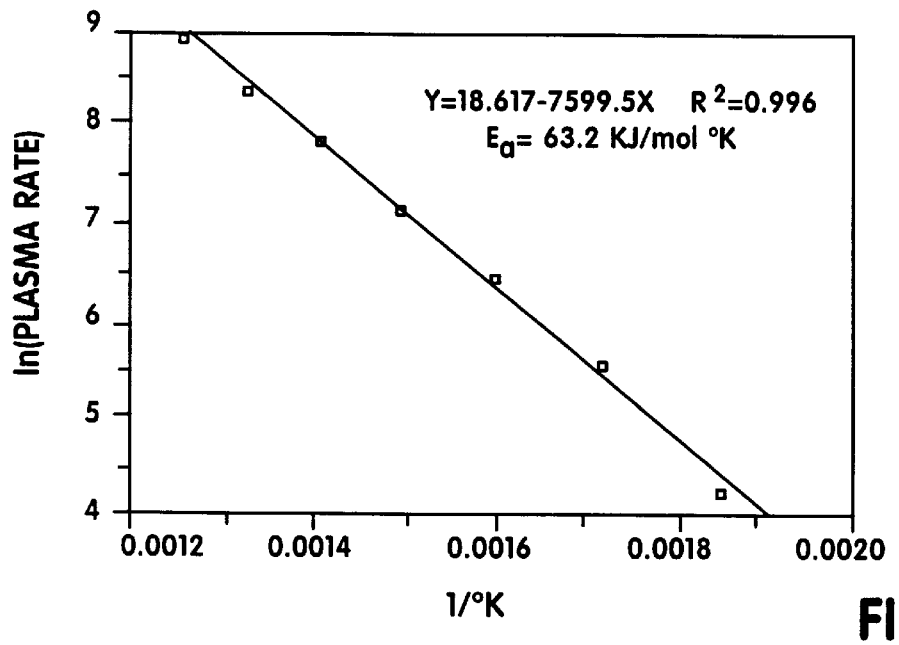

To verify that hydrogen radicals were actually reaching the substrate surface 23 and contributing to the CVD process, an activation energy comparison was made. Specifically, the tungsten deposition rate was measured as a function of substrate temperature. The measurements were made both with the microwave power turned off and no plasma and with the microwave power turned on to create a plasma and hydrogen radicals. The data measured is shown plotted in FIGS. 4A and 4B as a logarithmic Arrhenius function, i.e., plotted as In (k) versus 1/T, where k is the reaction rate constant and T is absolute temperature. The process and deposition parameters for both the non-plasma and plasma depositions illustrated by FIGS. 4A and 4B, respectively, were as follows:

H$_2$ rate=2,000 sccm

WF$_6$ rate=225 sccm

Pressure =4 Torr

Rotation rate of susceptor=30 RPM

A Microwave Power=900 Watts

From the experiments, and the resulting Arrhenius functions, the activation energy, E$_a$, was calculated. For the thermal process, that is, with the microwave power turned off, E$_a$=67.1 kJ/mole-degree K. However, when the microwave power was turned on to create a plasma, the activation energy necessary for the deposition process was only E$_a$=63.2 kJ/mole-degree K. The decrease in activation energy E$_a$ between the plasma and non-plasma deposition processes, indicates that activated hydrogen radicals are reaching the substrate surface and participating in the surface reaction according to the principles of the present invention. The decreased activation energy necessary when utilizing the activated radicals results in a decrease in the deposition temperature necessary for the CVD process. As discussed above, a lower deposition temperature is desirable for integrated circuit fabrication of temperature-sensitive circuits requiring deposition temperatures below 650° C.

Figure 5:
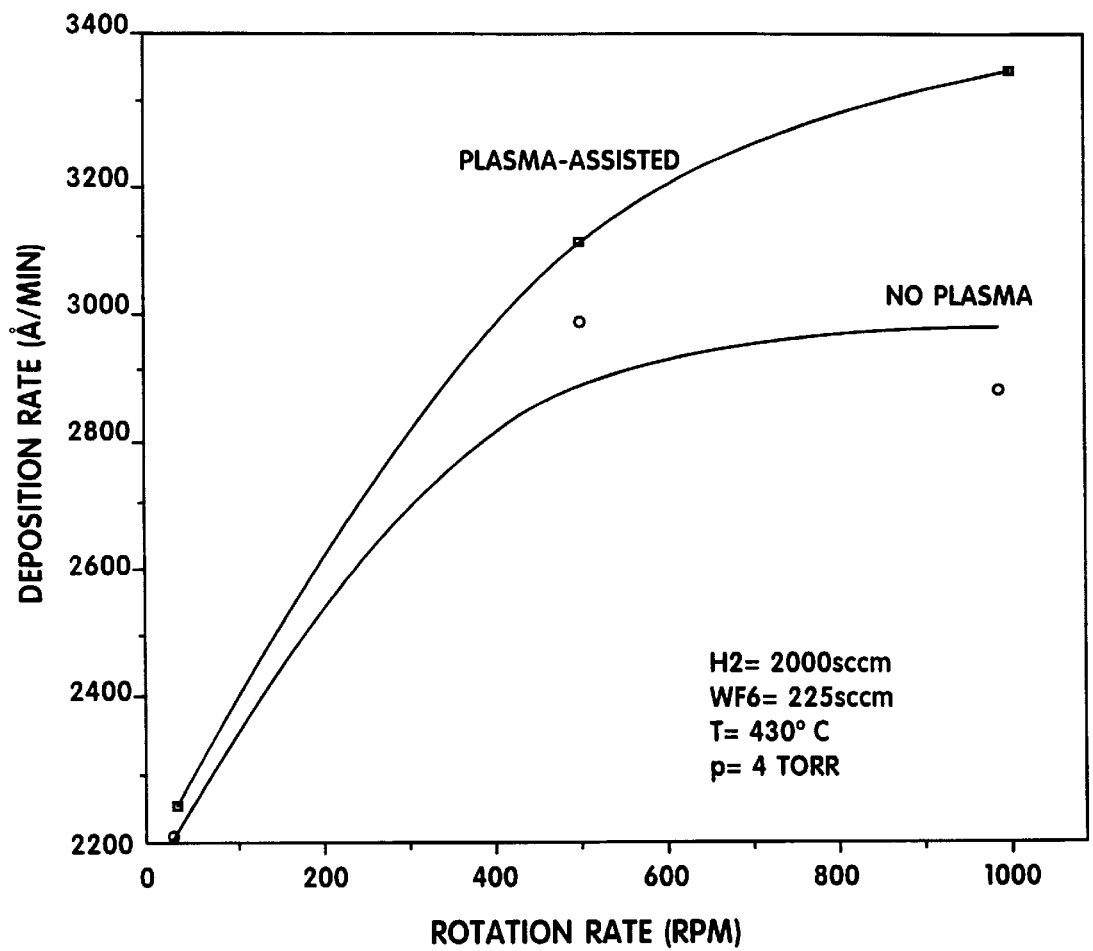
FIG. 5 are graphs of deposition rate increase as a function of rotation rate increase with and without the upstream activated radicals, respectively.

The deposition rate of tungsten was also plotted as a function of the susceptor rotation rate or substrate rotation rate. FIG. 5 illustrates that the deposition rate for the thermal process increased with increasing rotation rate as expected. This is due to the fact that the molecular reactants are being pumped to the rotating substrate surface at a higher rate. However, for the upstream radical-assisted process of the present invention, the deposition rate increased much more dramatically as the rotation rate increased. That is, there is an effect beyond the basic pumping of reactants caused by the rotating substrate which produces the increased deposition rate. With the upstream plasma method of the present invention, it was determined that the laminar gas flow pattern provided by the rotating susceptor minimizes the gas phase collisions, and thus reduces the rate at which the necessary activated hydrogen radicals H* recombine to form hydrogen molecules H$_2$. The efficient delivery of radicals to the substrate surface in the upstream method of the present invention is an important advancement in plasma-enhanced CVD. A majority of the activated radicals are carried to the substrate surface to take place in the surface deposition reaction. Therefore, not only do the activated radicals contribute energy and lower the deposition temperature, but also the high density of radicals delivered to the substrate by the laminar gas flow of susceptor 20 further reduces the deposition temperature below the impractically high temperatures of thermal CVD techniques.

Figure 1A:
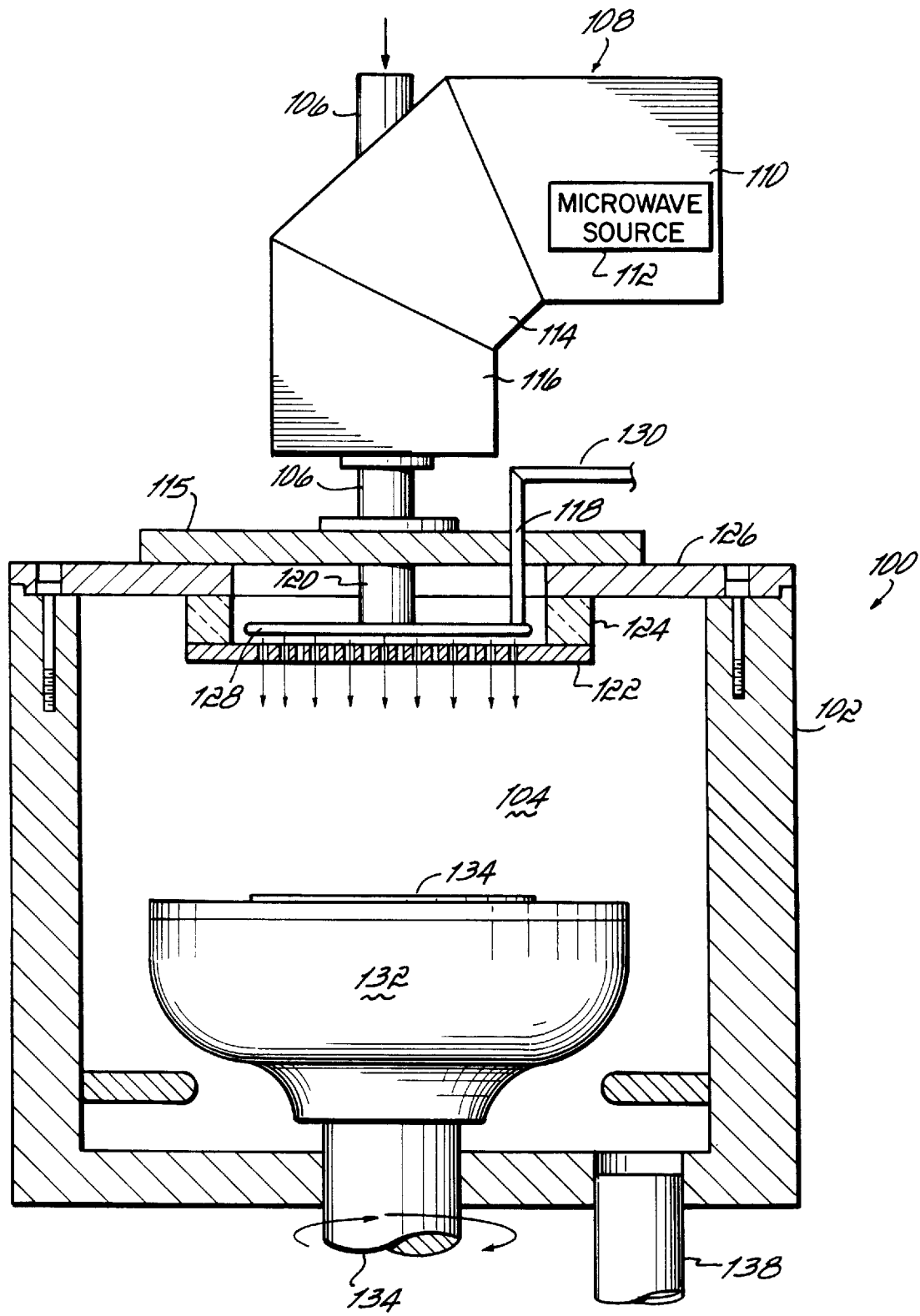
FIG. 1A is a view of an alternative embodiment of an upstream plasma-enhanced deposition chamber using microwave energy.

FIG. 1A shows an alternative CVD configuration which utilizes an upstream microwave source to generate activated gas radicals. A reactor 100 includes a chamber housing 102 enclosing reaction space 104. Like reactor 5 of FIG. 1, the housing may be controllably vacuumed to a desired internal deposition pressure. Plasma gases are introduced into a vertical quartz tube 106. A microwave wave guide structure 108 is coupled to quartz tube 106. Wave guide structure 108 includes a horizontal section 110 which includes a microwave source 112. An angled waveguide section 114 connects horizontal section 110 to a vertical waveguide section 116. Quartz tube 106 extends through an opening (not shown) in the angled section 114 and extends through section 114 and vertical section 116 whereupon it extends through a top cover plate 15 of housing 102. Quartz tube 106 extends through plate 118 and terminates at an outlet end 120 above a gas dispersing showerhead 122. Showerhead 122 is attached to a quartz insulator ring 124 which connects the showerhead 122 to the cover 115 of reactor housing 102. Also disposed above showerhead 122 and adjacent the outlet end 120 of quartz tube 106 is a reactant gas halo or dispersion ring 128 which has a plurality of openings for dispersing reactant gas. A source line 130 is connected to ring 128 for delivering a reactant gas such as TiCl$_4$ to the ring 128.

The microwave source 112 within wave guide section 110 may be a magnetron or any other suitable source which generates energy at microwave frequencies. For example, a coaxial waveguide adapter (not shown) might be attached onto one end of horizontal waveguide section 110 to generate the necessary microwave energy.

The upstream microwave plasma source and reactor 100 of FIG. 1A operates somewhat similarly to reactor 5 in FIG. 1. That is, a plasma gas such as hydrogen, nitrogen and/or ammonia is introduced into quartz tube 106 and travels along the quartz tube 106 and through the microwave waveguide structure 108 such that the gases are excited into a plasma within a section or area of tube 106. A rotating susceptor 132 supports a substrate 134 below showerhead 122 and halo 128. Similar to the rotating susceptor of FIG. 1, susceptor 132 is coupled to a temperature control device (not shown) which heats substrate 134 to a desired temperature. Furthermore, susceptor 132 is coupled by shaft 134 to a motor (not shown) such that the rotation of susceptor 132 may be set as desired. The rotating susceptor pumps the activated radicals from end 120 of quartz tube 106 and from reactant gas from ring 128 through showerhead 122 to react and deposit a film layer onto substrate 134. Preferably, the majority of activated plasma particles reaching substrate 134 are activated radicals which contribute energy to the surface reaction to achieve low temperature CVD. The remaining non-utilized gases are exhausted through an exhaust port 138.

Figure 2:
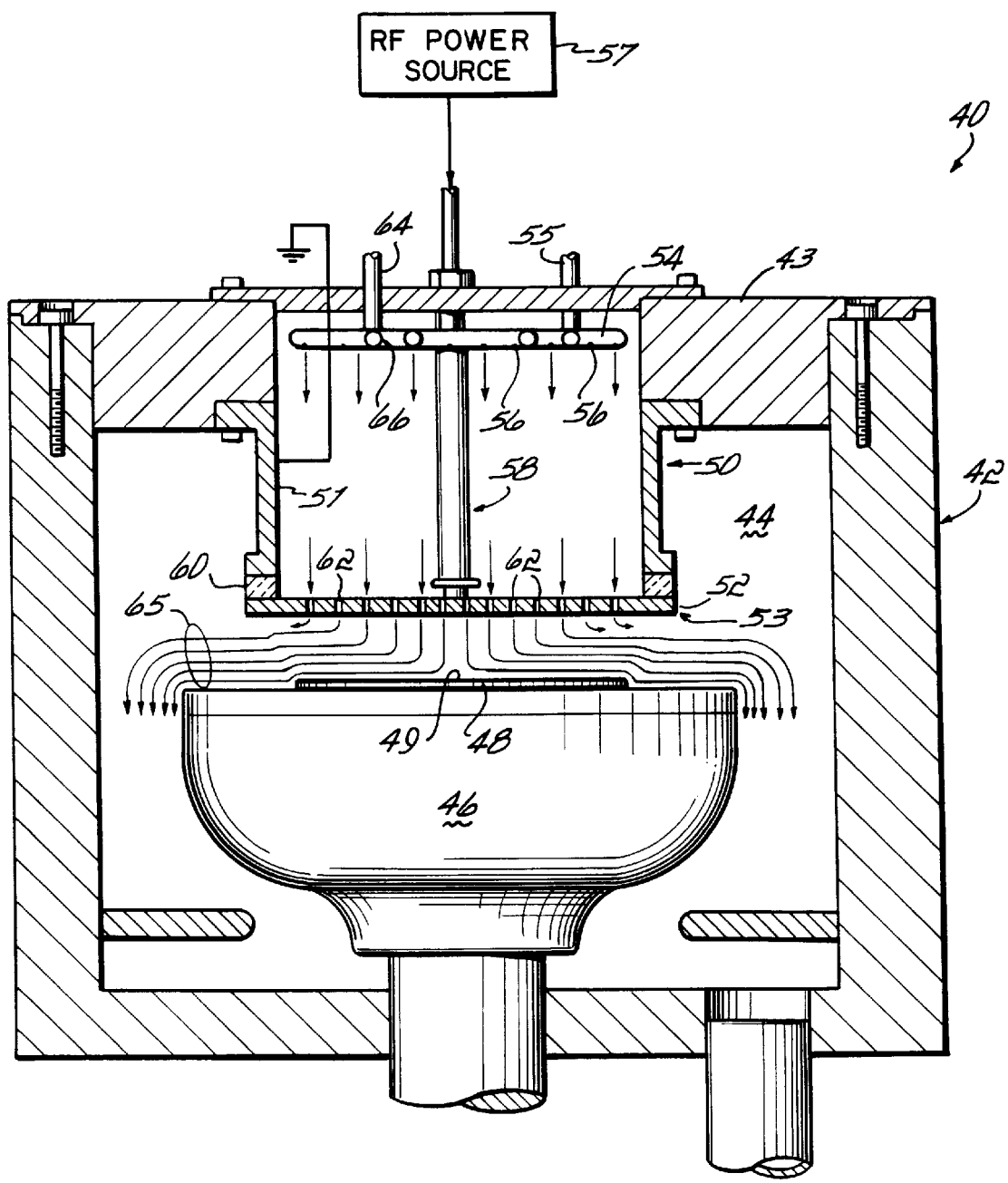
FIG. 2 is a side view and partial cross-section of one embodiment of a deposition chamber used to practice the methods of the present invention using an RF showerhead/electrode.

While the laminar gas flow of a rotating susceptor in combination with an upstream plasma source yields desirable radical densities, a method of low temperature CVD of titanium has also been achieved using a gas dispersing showerhead biased as an RF electrode in order to generate a plasma of ions and radicals close to the substrate such that both ions and radicals contribute to the low temperature surface reactions. Accordingly, FIG. 2 shows a preferred embodiment of a CVD reactor for achieving low temperature deposition using activated radicals and ions in accordance with the principles of the present invention. Referring to FIG. 2, the reactor 40 includes a deposition chamber housing 42 and housing cover 43 which defines a reaction space 44. Housing 42 also encloses a rotating susceptor 46 which supports a substrate 48 in space 44. Similar to the reactor of FIG. 1, reactor 40 may be selectively evacuated to various different internal pressures, while susceptor 46 is coupled to adjustable heat and rotational controls for heating and rotating substrate 48 at various temperatures and speeds, respectively.

Extending downwardly from the top of housing 42 is a cylinder assembly 50 which is attached to a showerhead 52. Showerhead 52 is suspended above substrate 48. The gases to be excited into a plasma are introduced through a gas injection ring 54 into cylinder assembly 50 through a plurality of ring holes 56. Ring 54 is connected to a plasma gas supply by line 55. Showerhead 52 is coupled to an RF power source 57 by feedline assembly 58 which extends through cylinder assembly 50 to showerhead 52. Cylinder assembly includes a cylinder 51, and insulator ring 60 which separates cylinder 51 and showerhead 52 for reasons discussed hereinbelow. In one embodiment of the reactor 40, cylinder 51 is electrically grounded. The RF energy biases showerhead/electrode 52 so that it acts as an electrode and has an associated RF field. Showerhead/electrode 52 is preferably approximately 0.25 inches thick and contains approximately 300–600 dispersion holes 62. The gases introduced through plasma gas injection ring 54 flow downwardly in cylinder 51. The RF field created by the biased showerhead/electrode 52 excites the gases so that a plasma is created below the lower surface 53 of showerhead/electrode 52. Preferably, the showerhead dispersion holes 62 are dimensioned somewhat smaller than the gas dispersion holes of traditional gas showerheads to prevent creation of a plasma in the holes 62 which results in deposition in the holes and subsequent bombardment of the substrate 48. Furthermore, the smaller holes 62 of the showerhead 52 prevent formation of a plasma above showerhead 52 inside of cylinder 51 thus concentrating the plasma below showerhead/electrode 52 and close to substrate 48. The showerhead holes 62, in a preferred embodiment, are dimensioned to be approximately 1/32 of an inch wide. Cylinder 51 preferably has the same diameter as showerhead/electrode 52 to spread the plasma and reactant gases over the entire showerhead 52.

The reactant gases, such as $TiCl_4$ are introduced through a ring 66 which is generally concentric with ring 54 and is connected to a reactant gas source by line 64. The gas flow from injector rings 54 and 66 develops within the length of the cylinder 51 as the gases travel to the showerhead/electrode 52. Utilizing the rotating susceptor 46, the cylinder 51, and showerhead/electrode 52, it is preferable for the velocity profile of the incoming plasma gases passing through showerhead 52 to be fully developed before it reaches the rotating substrate 48. The showerhead/electrode 52 is spaced between 0.25 to 4 inches from the substrate 48 to ensure that the plasma is close to the substrate 48. Preferably, the spacing is under 1 inch and in a preferred embodiment is approximately 20 millimeters. As the gases pass through the showerhead/electrode 52, the pressure drop across the showerhead/electrode 52 flattens out the velocity profile of the gases. That is, the gas tends to have the same velocity at the center of the showerhead/electrode 52 as around the periphery. This is desirable for uniform deposition of a film on substrate surface 49. The plasma gases pass through showerhead/electrode 52 and are excited into a plasma proximate the bottom side 53 of showerhead/electrode 52. As mentioned above, it has been found that an RF plasma may be excited with RF energy as low as 450 KHz and as high as 13.56 MHZ and the invention does not seem to be particularly frequency sensitive.

If susceptor 46 is rotated with the deposition configuration of FIG. 2, the pumping effect of the rotating susceptor 46 takes place below the showerhead/electrode 52. In the embodiment of the present invention as shown in FIG. 2, the unique use of showerhead/electrode 52 in very close proximity to substrate 48 produces a concentrated plasma with a large density of useful gas radicals and ions proximate the substrate surface 49. With the RF showerhead/electrode configuration of FIG. 2, it has been discovered that there does not seem to be a noticeable enhancement gained in rotating the susceptor 46 faster than approximately 100 rpm. It was also found, however, that a rotation rate of 0 rpm, although not drastically affecting the deposition rate, lowers the uniformity of the reactant and plasma gas flow and the subsequent deposition. Generally, a substrate rotation rate between 0 and 2,000 rpm might be utilized with the deposition configuration utilizing an RF showerhead/electrode.

As illustrated further hereinbelow, a susceptor rotation rate of approximately 100 rpm has proven to be sufficient for deposition. While it is preferable to utilize only radicals in the upstream plasma generation methods, both radicals and ions are present during the deposition using RF showerhead/electrode 52. That is, both ions and radicals supply energy to the surface reaction. While it is generally not desirable to use only ions due to their tendency to stick to contact and via surfaces and produce non-conformal films, some ion bombardment of the substrate 48 is beneficial because it supplies additional energy to the growing film layer on the surface 49 of the substrate 48. However, too much ion bombardment of substrate 48 may damage the integrated circuit devices of the substrate 48 and may lead to poor film conformality. Therefore, the deposition parameters and showerhead spacing are chosen as illustrated herein to achieve a useful mixture of radicals and ions. As discussed above, for the configuration of FIG. 2, the spacing is under 1 inch and preferably approximately 20 mm.

The reactant gases, such as $TiCl_4$, are introduced into cylinder 51 through another gas ring 66. The reactant gases travel down the length of cylinder 51 and are also excited by the RF field created by showerhead/electrode 52, as they pass through the openings 62 of showerhead 52. The reactant gas travels to the surface of substrate 48 along with the radicals and ions of the excited plasma. The radicals, ions and excited reactant gas particles react at the surface of substrate 48 to deposit a film such as a titanium-containing film, upon substrate 48.

Because of the close spacing of the showerhead/electrode 52 from substrate 48 in combination with cylinder 51, the gas mixture streamlines 65 emanating from showerhead 52 are close to the substrate 48 to provide efficient deposition and reduce the amount of gas mixture which bypasses the substrate 48. That is, the boundary layer of gas, which is defined as the volume or space below the gas streamlines 65 which is stagnant or non-moving with respect to the susceptor 46, is very small. Therefore, a large percentage of the radicals, ions and reactant gas particles are being utilized in the surface reaction, and accordingly, the efficiency of the CVD process and the deposition rate are increased.

With the showerhead/electrode 52 acting as an RF electrode, a more uniform plasma is generated at substrate 48, therefore enhancing the uniformity of radical and ion density at the substrate 48 and the uniformity of the deposited film. In the RF showerhead/electrode configurations of FIGS. 2, 2A and 2B the deposition rate reaches a maximum when the rotation rate is matched to the incoming plasma and reactant gas flow, i.e., matched gas flow. Accordingly, it is desirable to achieve matched flow when susceptor 46 rotates.

Figure 2A:
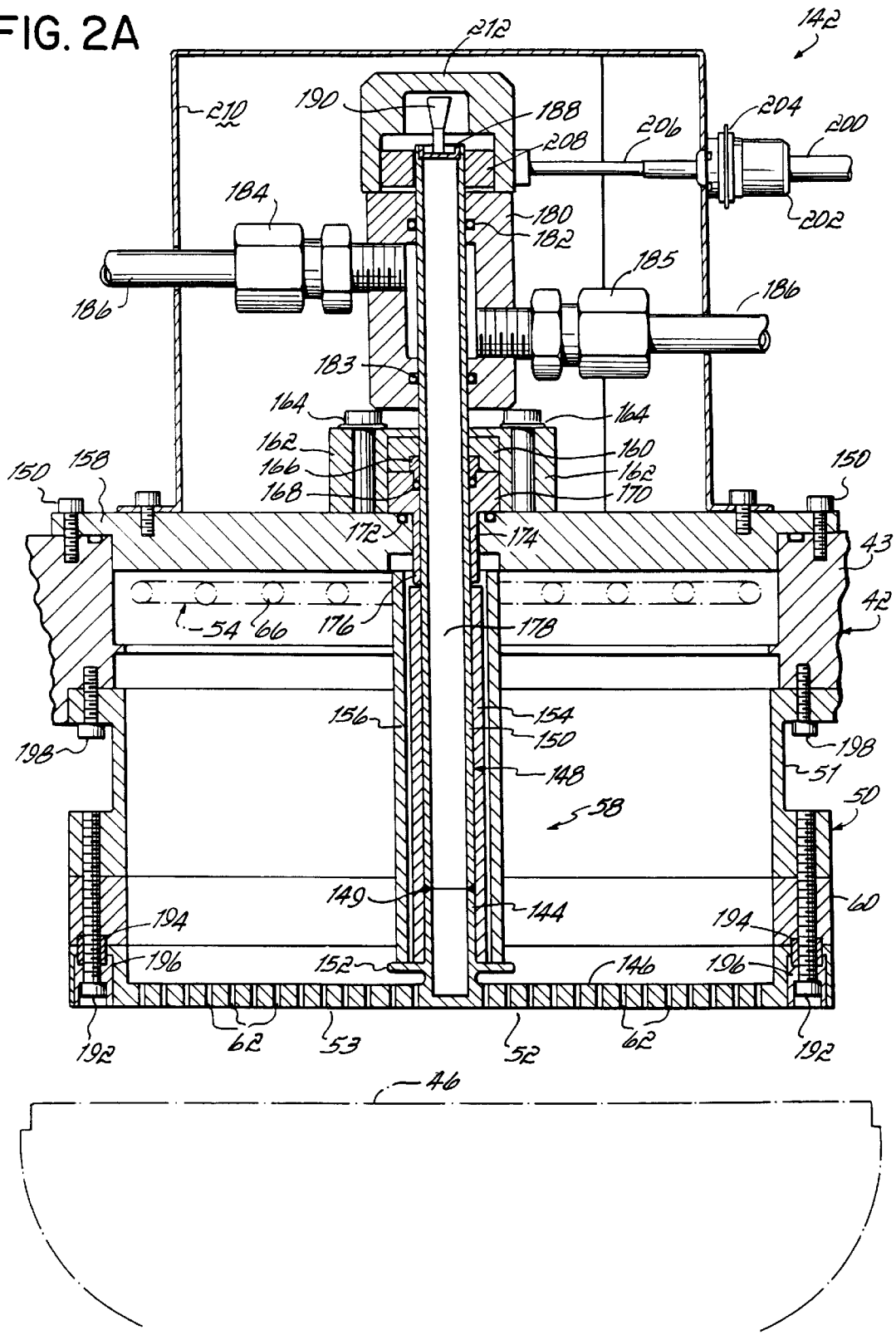
FIG. 2A is a more detailed view of the configuration of FIG. 2.

FIG. 2A discloses an RF showerhead/electrode configuration similar to the configuration of FIG. 2 except in greater detail. Wherever possible similar reference numerals will be utilized between FIGS. 2 and 2A. The configuration of FIG. 2A is similar to a structure disclosed within U.S. patent application Ser. No. 08/166,745, now U.S. Pat. No. 5,647,911, the disclosure of which is fully incorporated herein by reference.

In FIG. 2A, there is shown in break-away a portion of CVD deposition chamber housing 42, to which is mounted the RF showerhead/electrode apparatus 142 used to practice the low temperature deposition of the present invention. It will be appreciated by persons skilled in the art that certain features to be described may pertain to one or more, but less than all, embodiments of the invention. In FIG. 2A, the showerhead/electrode 52 includes an RF line stem 144 mounted thereto. As will be discussed in further detail, the RF line stem 144 is one of several components making up the RF feedline assembly 58. The RF feedline assembly 58 also acts as a heat pipe to conduct heat away from showerhead/electrode 52 as is also discussed further hereinbelow. Preferably, line stem 144 is machined concentrically into and is integral with upper surface 146 of showerhead/electrode 52 to increase the RF signal conduction and heat conduction efficiency. RF line 148 comprises line stem 144 and an additional length of tubing 150 welded thereto to achieve the desired overall length of the RF line 148. The weld is represented at 149. Preferably, showerhead/electrode 52 and integral line stem 144 are made of Nickel-200, while RF line tubing 150 is made of a highly conductive material such as 6061-T6 aluminum. However, it will be appreciated by persons skilled in the art that other materials can be used for the RF line 150, such as nickel 200. In one embodiment, the RF line 148 is made of aluminum coated with nickel to prevent an RF plasma from forming within said cylinder 51 of the cylinder assembly 50 during the plasma-enhanced CVD reactions of the present invention. Preferably, the showerhead/electrode is approximately 0.25 inches thick.

Figure 2B:
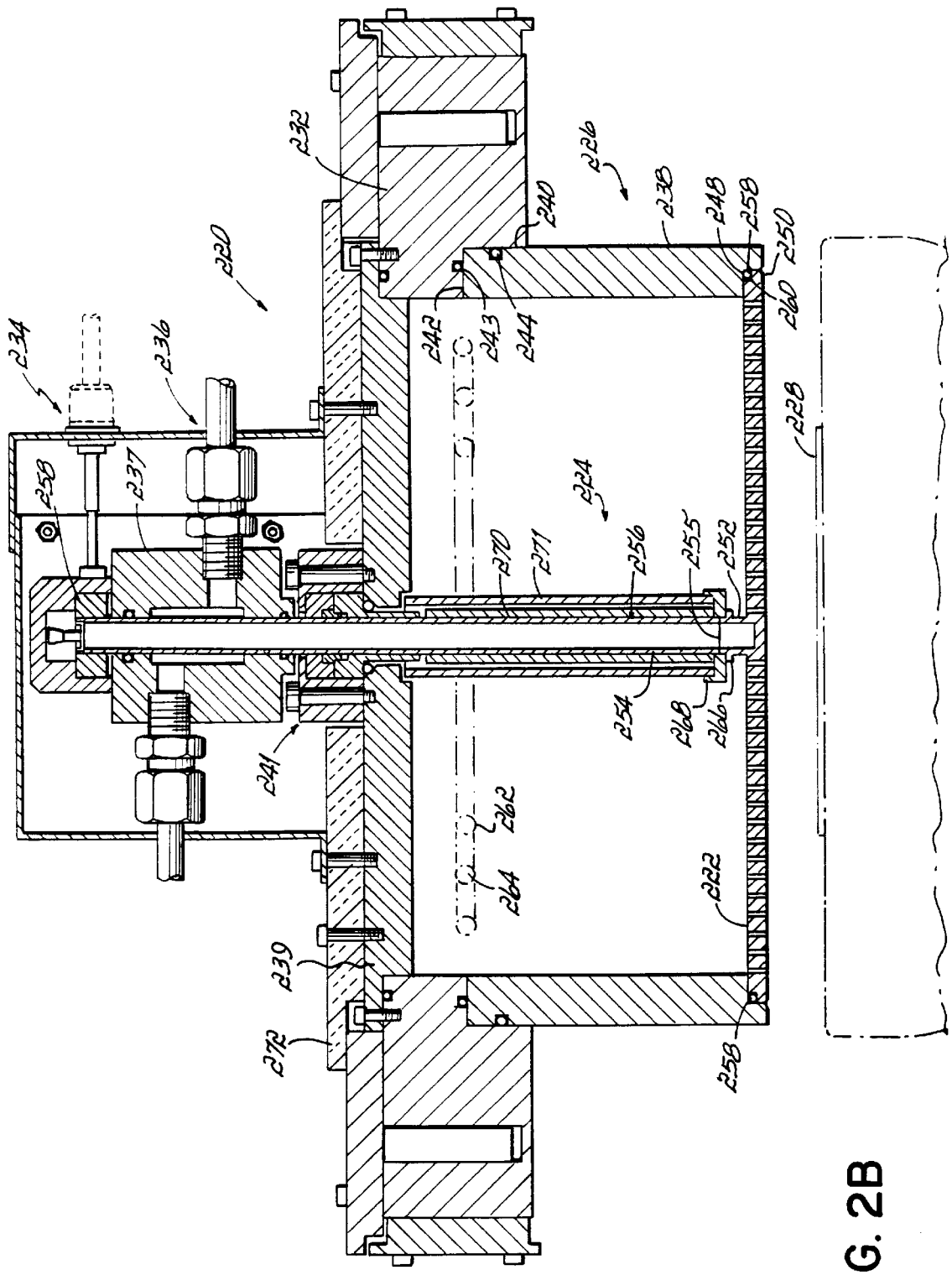
FIG. 2B is an alternative embodiment of the configuration of FIG. 2.

Showerhead/electrode 52 is perforated with a pattern of gas dispersion holes 62 to distribute the reactant and plasma gases evenly during CVD processing. As shown in FIG. 2A, upstanding RF line stem 144 is provided with a circumferential shoulder flange 152 adjacent and parallel to showerhead/electrode 52. The flange 152 is spaced above showerhead/electrode upper surface 146 and permits the gas dispersion hole pattern to extend beneath the shoulder flange 152, thereby minimizing gas flow disturbances. Furthermore, the flange 152 aids in the conduction of the RF energy along line 148 to showerhead/electrode 52, assists in cooling showerhead/electrode 52, and provides mechanical support for ceramic isolator tubes 154, 156. An alternative embodiment of the showerhead electrode configuration eliminates the flange 152 as shown in FIG. 2B.

The RF showerhead/electrode apparatus 142 of FIG. 2A further includes first and second ceramic isolator tubes 154, 156, respectively, which are concentric with and surround at least a portion of RF line 148. As shown, ceramic isolator tubes 154, 156 are supported by circumferential shoulder flange 152. Tubes 154, 156 are preferably formed of alumina (99.7% $Al_2O_3$) which is readily commercially available such as from Coors Ceramics of Golden, Colo. One function of these isolator tubes 154, 156 is to prevent RF plasma from forming around the RF line 148 during CVD processing by isolating the RF line 148 from the plasma and reactant gases in the cylinder assembly 50. As may be appreciated, it is desirable to prevent the formation of any plasma within the cylinder assembly 50 in order to concentrate the plasma below showerhead/electrode 52. Therefore, the isolator tubes 154, 156 operate to prevent the formation of such a plasma inside of the cylinder assembly 50. Additionally, and as described more fully below, the isolator tubes 154, 156 aid in preventing electrical shorting between gas distributor cover 158 (which is at ground potential) and RF line 148 at the location where RF line 148 passes through gas distributor cover 158. Gas distributor cover 158 is mounted to housing 42 by means of a plurality of screws 150. As shown in the FIG. 2A, gas injection rings or halos such as rings 54, 66 (shown in phantom) are located slightly below gas distributor cover 158 and supply the CVD reaction and plasma gases to the inside of cylinder assembly 50. Gas injection rings 54, 66 may be two of a plurality of concentric rings for introducing numerous reactant gases.

A seal prevents vacuum leaks at the location where RF line 148 passes through gas distributor cover 158. This is accomplished by means of a shaft seal and a flange seal. As shown in the FIG. 2A, a ceramic seal plate 160 is pressed downwardly by two stainless steel clamps 162. Clamps 162 are biased against distributor cover 158 by spring washer/screw assemblies 164 to obtain a predetermined downward force on the seal components to insure proper sealing, to accommodate tolerance stacks in the seal components, and to take up dimensional changes due to thermal expansion which may occur during CVD processing. Seal plate 160 presses downwardly on a stainless steel ferrule 166 which in turn presses down on an O-ring 168 seated in ceramic seal body 170. The downward force exerted by clamps 162 on seal plate 160 also forces seal body 170 downwardly against gas distributor cover 158, which compresses the O-ring 172 located between seal body 170 and gas distributor cover 158. It should be noted that seal body 170 has a downwardly extending annular flange 174 which surrounds RF line 148 over the entire length of it which passes through gas distributor cover 158. The lower end 176 of annular flange 174 extends downwardly to a point where it meets ceramic isolator tube 154. As shown, the outer ceramic isolator tube 156 extends further upward than isolator tube 154, such that there is no direct line between gas distributor cover 158 and RF line 148. This prevents arcing when the RF line 148 is used to power showerhead/electrode 52.

The RF line 148 also functions as a heat pipe structure. With respect to heat pipe structures, such devices are known per se, and in the present invention, the heat pipe structure is used to carry off heat from the showerhead/electrode 52 generated by radiant energy from the heated susceptor 46, as well as by the RF energy applied to the showerhead/electrode. The center space 178 of RF line 148 is provided with a felt or other suitable capillary wicking material liner (not shown). Space 178 is sealed with a liquid (e.g., acetone) therein under its own vapor pressure that enters the pores of the capillary material wetting all internal surfaces of RF line 148. By applying heat at any point along the length of the RF line, the liquid at that point boils and enters a vapor state. When that happens, the liquid in the wicking material picks up the latent heat of vaporization and the vapor, which then is at a higher pressure, moves inside the sealed pipe to a cooler location where it condenses and re-enters the liner. Thus, the vapor gives up its latent heat of vaporization and moves heat from the "input" to the "output" end of the heat pipe structure. As a general frame of reference, heat may be moved along a heat pipe at a rate of approximately 500 mph.

With reference to the specific configuration utilized in FIG. 2A, the "input" end of the heat pipe structure is the end which is affixed to showerhead/electrode 52. The "output" end is the upper end shown in the FIG. 2A which has a liquid-cooling jacket 180 sealed around it. The seal is effected by O-ring shaft seals 182 and 183. Cooling jacket 180 is preferably a polymeric material and is provided with TEFLON compression fittings 184 and 185 which connect TEFLON tubing 186 to cooling jacket 180. A suitable cooling liquid, such as water, flows through tubing 186 and cooling jacket 180 to carry heat away from RF line 148. This permits direct contact of the cooling liquid with the RF line 148 for efficient conduction of heat from the line 148. Additionally, with this configuration, at no time is the CVD reactor chamber exposed to the possibility of an internal coolant leak, nor is there any corrosive effect on metal tubing by RF carrying liquid. As stated, the fluid which passes through TEFLON tubing 186 and carries the heat away from the RF line 148 may be water, although a variety of fluids can be used depending on the heat to be conducted away from the line 148. RF line 148 also includes a cap 188 which is welded in place and has a fill tube 190 for filling the internal space 178 with the desired fluid. A suitable commercially available heat pipe may be obtained from Thermocore Inc., of Lancaster, Pa.

As shown in FIG. 2A, an aluminum cylinder 51 is utilized to vary the showerhead/electrode substrate spacing(s). Showerhead/electrode 52 is fastened to cylinder 51 by means of screws 192, which are preferably made of a material that does not corrode in the presence of an RF plasma. One such material is Hastelloy C-22, which is a trade name of Hanes International, of Kokomo, Ind. Suitable screws made of this material are available from Pinnacle Mfg. of Tempe, Ariz. Quartz ring 60 electrically isolates showerhead/electrode 52 from aluminum cylinder 51. A suitable quality quartz for ring 60 is Quartz T08-E available from Hereaus Amersil in Tempe, Ariz. Screws 192, which are at ground potential, are isolated from the showerhead/electrode 52 by two interlocking ceramic isolator sleeves 194 and 196. Quartz is used for isolator ring 60 because of its significant resistance to thermal shock. This can be important since the RF showerhead/electrode 52 below quartz ring 60 becomes heated to a higher temperature, and more rapidly than aluminum cylinder 51 above quartz ring 60, thus inducing thermal shock and stress in ring 60. Screws 198, which may be made of the same material as screws 192, are utilized to affix aluminum cylinder 51 to housing 42. As discussed above, various length cylinders 51 might be utilized to vary the showerhead/electrode-to-substrate spacing. It is preferable that the length of cylinder 51 be chosen to position showerhead/electrode 52 within 1 inch of susceptor 46.

RF energy is conducted to showerhead/electrode 52 by RF feedline assembly 58 comprising stem 144 and tube 150. Isolator tubes 154, 156 are needed to electrically isolate and prevent arcing between tubing 150 and any parts of the metal housing 42, including distributor cover 158. Furthermore, the apparatus includes a seal around tubing 150 at the location where it passes through distributor cover 158, as described hereinabove and shown in FIG. 2A.

RF energy is supplied through a shielded RF supplying cable 200 which is connected to an RF power source 57 (not shown in FIG. 2A) and has a UHF connector 202 at one end. Connector 202 mates with another UHF connector 204, which in turn is coupled via a length of 12 gauge wire 206 to a stainless steel shaft collar 208 mounted at the upper end of RF line 148. With this arrangement there is minimal resistance to the flow of RF current. The segment of RF line 148 which is exposed above shaft collar 208 is isolated from the grounded metal shielding 210 by a polymer cap 212. The apparatus is believed to be capable of delivering 250–300 watts of RF power at 450 KHz to 13.56 MHZ.

FIG. 2B shows an alternative embodiment of the RF showerhead/electrode configuration utilized to practice the present invention. The CVD apparatus 220 of FIG. 2B operates similarly to the apparatuses shown in FIGS. 2 and 2A. That is, an RF showerhead/electrode 222 is biased by an RF feedline assembly 224 while plasma and reactant gases are pumped through a cylinder assembly 226 to a substrate 228 on susceptor 230. However, the embodiment of FIG. 2B eliminates the metal cylinder 51 and insulator ring 60 of FIGS. 2 and 2A while preventing electrical arcing inside of the cylinder assembly 226 proximate the RF line and preventing the undesired formation of plasma within the cylinder assembly 226 when the showerhead 222 is biased as an electrode. The embodiment of FIG. 2B utilizes a housing, such as one similar to housing 42 of FIG. 2, which includes a housing cover 232 and includes an RF supply assembly 234, a heat pipe assembly 236 with cooling jacket 237 and associated fluid supply lines and a gas distributor cover 239 with a sealing assembly 241 all generally similar to the respective components of FIG. 2. However, the cylinder assembly 226 does not include a metal cylinder 51 and insulator ring 60 as shown in FIG. 2. Rather, a cylinder 238 made of an insulating material such as quartz surrounds the RF feed line assembly 224.

Cylinder 238 is preferably formulated out of a high quality quartz such as Quartz T08-E available from Hereaus Amersil, as mentioned above. Quartz cylinder 238 is supported by a nickel showerhead/electrode 222, made of a conductive metal such as Nickel-200, without the use of screws or other fasteners that are utilized within the embodiments of FIGS. 2 and 2A. Specifically, a stepped bore 240 is formed within housing cover 232 to receive an upper end 242 of cylinder 238. O-rings 243, 244 are placed at the interface between stepped bore 240 and cylinder 238 to form a seal at the interface. At the lower end 246 of cylinder 238, an annular notch 248 is formed in cylinder 238 to receive a peripheral edge 250 of the showerhead/electrode 222. The notch 248 of cylinder 238 rests upon the peripheral edge 250 of showerhead/electrode 222. Showerhead/electrode 222 includes a stem 252 which is attached to RF line tubing 254, such as by a weld at 255, to form a unitary RF line 256. RF line 256 is frictionally held and supported at its top end by collar 258 similar to collar 208 of FIG. 2A. The RF line, in turn, supports showerhead/electrode 222 above susceptor 230. Showerhead/electrode 222, in turn, supports the cylinder 238 within the cylinder assembly 226 by abutting against cylinder 238 at notch 248 and holding it in bore 240. The interface between showerhead/electrode peripheral edge 250 and cylinder notch 248 is sealed by a compressed O-ring 258 which is compressed between shelf 248 and a similar corresponding annular notch 260 formed in peripheral edge 250 of the showerhead/electrode 222. Similar to the embodiments of FIGS. 2 and 2A, a plurality of gas halos or rings 262, 264 introduce the necessary plasma and reactant gases into cylinder 238.

The embodiment of FIG. 2B eliminates the need for metal screws to attach the cylinder 238 to the housing cover 232 and the showerhead/electrode 222 to the cylinder 238. This further reduces the possibility of arcing inside of cylinder 238 because of the reduced metal proximate the biased RF showerhead/electrode 222. Furthermore, it is not necessary to utilize ceramic isolator sleeves at the showerhead peripheral edge 250.

Accordingly, the RF showerhead/electrode 222 has also been modified. Showerhead/electrode 222 includes a stem 252 without a flange. Instead, a slight ridge 266 is formed around stem 252, and as shown in FIG. 2A, ridge 266 supports a generally circular ceramic tray 268 which is formed from a ceramic material, such as alumina (99.7% $Al_2O_3$), similar to the ceramic isolator sleeves 154, 156 shown in FIG. 2A. Ceramic tray 268 is supported by ridge 266, and in turn, supports isolator sleeves 270, 271. Isolator sleeves 270, 271 are also preferably made of a ceramic insulator material similar to that used for sleeves 154, 156 of FIG. 2A. As with the embodiments used to practice the present invention which are discussed above, preferably the holes of showerhead/electrode 22 are approximately 1/32 (0.0313) inches in diameter to prevent the formation of a plasma inside cylinder 238 and to confine the plasma generally below the showerhead/electrode 222 and above the susceptor 230. The embodiment of FIG. 2B utilizes quartz cylinder 238 and eliminates the metal attachment screws proximate showerhead/electrode 222 which helps to prevent the formation of a plasma within cylinder 238 and to prevent arcing between the RF line 256 and showerhead/electrode 222 and any of the surrounding metal. A layer of insulation 272 may be placed atop gas distributor cover 239 to prevent contact by an operator, because the gas distributor cover 239 becomes very hot during operation.

Numerous deposition runs have been made utilizing the RF electrode/showerhead configuration of FIGS. 2 and 2A to illustrate the viability of the present invention. Specifically, a layer of titanium nitride was deposited upon a substrate wafer at approximately a temperature of 400° C. This is substantially lower than the substrate temperature which is ordinarily required for thermal CVD processes to take place, which may be well over 1,000° C. For example, a layer of titanium nitride was deposited using ammonia gas ($NH_3$) and nitrogen gas ($N_2$) with the parameters listed below and the results shown in Table 1. The configuration of the present invention utilizes plasma gas flows between 500 and 5,000 sccm (50 to 500 sccm for $NH_3$) while a reactant gas flow, such as $TiCl_4$, between 0.5 and 10 sccm is desired. The reaction space 44 should be evacuated between 0.5 to 10 Torr.

Deposition Parameters for Table No. 1
$TiCl_4$ (sccm) 10
$NH_3$ (sccm) 500
$N_2$ (sccm) 500
RF Power (watts) 250 @ 450 KHz
Reaction Chamber Pressure (Torr) 1
Susceptor Rotation Rate (rpm) 100
Substrate Temp. (°C.) 400

TABLE NO. 1

| Results and Additional Deposition Parameters | WAFER NO. | | | | | |
|---|---|---|---|---|---|---|
| | 1 | 2 | 3 | 4 | 5 | 6 |
| TiN layer thickness (Å) | 800 | 698 | 608 | 545 | 723 | 910 |
| Deposition Rate (Å/min) | 400 | 348 | 304 | 272 | 241 | 303 |
| Layer Resistivity ($\mu\Omega$-cm) | 1519 | 1194 | 970 | 940 | 1021 | 1284 |
| Deposition Time (sec). | 120 | 120 | 120 | 120 | 180 | 180 |
| Susceptor Temp (°C.) | 414 | 471 | 457 | 461 | 462 | 475 |

Wafers 1–3 were silicon, while wafers 4–6 were thermal oxide wafers having a thin layer of silicon dioxide on the surface. This was done to ensure that the process of the present invention may be utilized in a broad range of CVD applications for both silicon wafers and oxide wafers. Each of the substrate wafers of Table 1 were also given an RF plasma ammonia ($NH_3$) anneal in the apparatus of FIG. 2 at 250 Watts for approximately 120 seconds with a gas concentration of 5,000 sccm of $NH_3$ at a pressure of 5 Torr. The rotation rate of the susceptor during the anneal was approximately 100 rpm. The $NH_3$ RF plasma improves the film quality of the deposited TiN film as discussed further hereinbelow.

The RF plasma electrode/showerhead configuration, in accordance with the principles of the present invention, may be utilized to deposit a titanium nitride (TiN) layer on a substrate utilizing both nitrogen gas ($N_2$) and hydrogen gas ($H_2$) instead of ammonia gas ($NH_3$). The various film results and deposition parameters for the $H_2$ and $N_2$ low temperature deposition of TiN are given below in Table Nos. 2, 3, 4 and 5, at increasing deposition temperatures for increasing table numbers.

Deposition Parameters for Table No. 2
$TiCl_4$ (sccm) 10
$H_2$ (sccm) 500
$N_2$ (sccm) 500
RF Power (watts) 250 @ 450 KHz
Reaction Chamber Pressure (Torr) 1
Susceptor Rotation Rate (rpm) 100
Substrate Temp. (°C.) 400
Deposition Time (seconds) 180

TABLE NO. 2

| Results and Additional Parameters | WAFER NO. | | | | | | | | | |
|---|---|---|---|---|---|---|---|---|---|---|
| | 1 | 2 | 3 | 4 | 5 | 6 | 7 | 8 | 9 | 10 |
| TiN layer thickness (Å) | 825 | 1023 | 1221 | 1262 | 1227 | 1224 | 1141 | 1348 | 1400 | 1106 |
| Deposition Rate (Å/min) | 275 | 341 | 407 | 421 | 409 | 408 | 380 | 449 | 487 | 389 |
| Layer Resistivity ($\mu\Omega$-cm) | 1530 | 26864 | 4118 | 3108 | 855 | 4478 | 3982 | 4658 | 3449 | 4501 |
| Susceptor Temp (°C.) | 470 | 480 | 488 | 470 | 470 | 460 | 460 | 460 | 460 | 460 |

Wafers 1 and 2 of Table No. 2 were silicon, while the remaining wafers 3–10 were thermal oxide. Wafers 6–10 received a 250 Watt RF plasma anneal for 120 seconds at an $NH_3$ gas rate of 5,000 sccm, at an internal pressure of 3 Torr (wafer 6 was done at 5 Torr), and a susceptor rotation rate of 100 rpm.

Table No. 3 illustrates the results of deposition runs utilizing a substrate temperature of 450° C., but maintaining the same gas and deposition parameters as were used in the deposition runs of Table No. 2. Wafer 1 and 2 were silicon while wafers 3–8 were thermal oxide. The results are as follows with wafers 6–8 of Table No. 3 receiving a 120 second RF plasma ammonia anneal at 5000 sccm, 5 Torr and a 100 rpm rotation rate with a power level of 250 Watts.

TABLE NO. 3

| Results and Additional Parameters | WAFER NO. | | | | | | | |
|---|---|---|---|---|---|---|---|---|
| | 1 | 2 | 3 | 4 | 5 | 6 | 7 | 8 |
| TiN layer thickness (Å) | 996 | 1009 | 1064 | 1488 | 1562 | 1444 | 1381 | 1306 |
| Deposition Rate (Å/min) | 332 | 336 | 355 | 496 | 521 | 481 | 454 | 435 |
| Layer Resistivity ($\mu\Omega$-cm) | 640 | 607 | 666 | 815 | 821 | 7121 | 5812 | 6363 |
| Susceptor Temp (°C.) | 518 | 519 | 521 | 524 | 521 | 522 | 524 | 523 |

The low temperature TiN deposition was repeated with the substrate temperature at 500° C. and the results are tabulated according to Table No. 4 below. Wafer 1 was silicon and wafers 2–7 were thermal oxide.

TABLE NO. 4

| Results and Additional Parameters | WAFER NO. | | | | | | |
|---|---|---|---|---|---|---|---|
| | 1 | 2 | 3 | 4 | 5 | 6 | 7 |
| TiN layer thickness (Å) | 990 | 1086 | 1034 | 1092 | 1004 | 1001 | 1004 |
| Deposition Rate (Å/min) | 330 | 362 | 345 | 364 | 335 | 334 | 335 |
| Layer Resistivity ($\mu\Omega$-cm) | 578 | 687 | 700 | 786 | 1892 | 1840 | 1886 |
| Susceptor Temp (°C.) | 579 | 590 | 597 | 595 | 591 | 593 | 594 |

Wafers 1–4 in Table No. 4 were not annealed, while wafers 5–7 were annealed using a similar RF plasma $NH_3$ anneal process and the parameters used for the deposition runs referenced in Table No. 3.

Similarly with a substrate temperature of 600° C., the CVD process of the present invention was used to deposit TiN with the results shown in Table No. 5 below, with wafers 1 and 2 being silicon and wafers 3–8 being thermal oxide.

TABLE NO. 5

| Results and Additional Parameters | WAFER NO. | | | | | | | |
|---|---|---|---|---|---|---|---|---|
| | 1 | 2 | 3 | 4 | 5 | 6 | 7 | 8 |
| TiN layer thickness (Å) | 657 | 822 | 740 | 768 | 767 | 765 | 773 | 910 |
| Deposition Rate (Å/min) | 219 | 274 | 247 | 263 | 256 | 255 | 258 | 303 |
| Layer Resistivity ($\mu\Omega$-cm) | 391 | 254 | 432 | 543 | 471 | 949 | 973 | 2710 |
| Susceptor Temp (°C.) | 650 | 650 | 650 | 650 | 650 | 650 | 650 | 656 |

Again, an RF plasma $NH_3$ anneal was performed on substrate wafers 6–8 of Table No. 5 similar to the anneal step of tables 3 and 4 except at a pressure of 1 Torr instead of 5 Torr. Therefore, the deposition of TiN using the low temperature CVD process of the present invention may be accomplished at various temperatures lower than the temperatures necessary for traditional thermal CVD.

While titanium nitride may be deposited with the present invention, it may also be desirable to deposit simply a layer of pure titanium. For example, a titanium layer might be deposited upon a silicon wafer which then reacts with the titanium to form a film of titanium silicide ($TiSi_2$). To this end, the present invention may also be used to deposit layer of titanium.

Table No. 6 below sets forth the results and parameters of a deposition run which resulted in a deposited film of approximately 84% titanium on a thermal oxide wafe at 650° C. This was an excellent result for such low temperature chemical vapor deposition. The deposition run of Table 6 was performed according to the following deposition parameters, with the RF showerhead/electrode configuration of FIG. 2.

Deposition Parameters for Table No. 6
  $TiCl_4$ (sccm) 10
  $H_2$ (sccm) 500
  RF Power (watts) 250 @ 450 KHz
  Reaction Chamber Pressure (Torr) 1
  Susceptor Rotation Rate (rpm) 100
  Deposition time (sec) 2700
  Substrate Temperature (°C.) 565

TABLE NO. 6

| Results and Additional Parameters | WAFER NO. |
|---|---|
| | 1 |
| Ti layer thickness (Å) | 1983 |
| Deposition Rate (Å/min) | 44 |
| Layer Resistivity ($\mu\Omega$ -cm) | 929 |
| Susceptor Temp (°C.) | 651 |

The substrate wafer of Table No. 6 was not annealed.

Additional Ti-layer deposition runs were made according to the Table No. 7 parameters below with the following results shown in Table No. 7:

Deposition Parameters for Table No. 7

TiCl$_4$ (sccm) 10
H$_2$ (sccm) 500
RF Power (watts) 250 @ 450 KHz
Reaction Chamber Pressure (Torr) 0.85
Susceptor Rotation Rate (rpm) 100
Deposition time (sec) 120 (wafer 7 for 180 sec)
Substrate Temperature (°C.) 565
Susceptor Temperature (°C.) 650

TABLE NO. 7

| Results and Additional Parameters | WAFER NO. | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Ti layer thickness (Å) | 134.8 | 466.2 | 209.2 | 100.8 | 194.04 | 154.98 | 115.92 | 114.7 | 152.5 | 39.06 | 41.6 | 50.4 |
| Deposition Rate (Å/min) | 67.4 | 233.1 | 104.6 | 50.4 | 97.0 | 77.5 | 38.6 | 57.3 | 76.2 | 19.5 | 20.6 | 25.2 |
| Layer Resistivity (μΩ-cm) | 2116.1 | 1767.8 | 761.8 | — | — | — | 1001.4 | 371.6 | 321.6 | — | — | — |

Wafers 1–3 and 7–9 of Table 7 were silicon while the remaining wafers were thermal oxide. None of the wafers of Table No. 7 received an RF plasma anneal of NH$_3$.

Since a benefit of chemical vapor deposition of titanium-containing films is improved step coverage and film conformality over the physical deposition techniques, several of the film layers deposited according to the present invention were tested to measure conformality and step coverage. The layers tested for conformality and step coverage were deposited according to the parameters of Table No. 8 with the results shown in Table No. 8 below. The film conformality and step coverage of the film layers deposited according to the parameters below were very good.

Deposition Parameters for Conformality and Step Coverage Deposition Runs of Table 8

TiCl (sccm) 10
H$_2$ (sccm) 500
N$_2$ (sccm) 500
RF Power (watts) 250 @ 450 KHz
Reactor Chamber Pressure (Torr) 1
Susceptor Rotation rate (rpm) 100
Substrate Temperature (°C.) 450
Susceptor Temperature (°C.) 520

TABLE NO. 8

| Results and Additional Parameters | WAFER NO. | |
|---|---|---|
| | 1 | 2 |
| TiN layer thickness (Å) | 586 | 2423 |
| Deposition Rate (Å/min) | 362 | 304 |
| Layer Resistivity (μΩ-cm) | — | — |
| Susceptor Temp (°C.) | 520 | 520 |

None of the wafers used in Table 8 and tested for step coverage were annealed with an RF plasma of NH$_3$.

As illustrated above a layer of titanium nitride (TiN) may be deposited in accordance with the principles of the present invention without utilizing ammonia gas (NH$_3$). Instead, a mixture of H$_2$ and N$_2$ gases is used. Low temperature deposition of titanium nitride using TiCl$_4$, N$_2$, and H$_2$ is desirable because it reduces contaminants within the reaction chamber that are formed by the chemical reactions of TiCl$_4$ and NH$_3$. More specifically, TiCl$_4$ reacts with NH$_3$ at temperatures below 120° C. to form a yellow powdery adduct, and to prevent the adduct from forming it was necessary in the past to heat the reaction chamber walls to at least 150° C. Since it is now possible to deposit a layer of titanium nitride at low temperatures using TiCl$_4$, N$_2$, and H$_2$ chemistry instead of NH$_3$, it is no longer necessary to remove a deposited adduct or to heat the reaction chamber walls, thus greatly reducing the cost of CVD systems.

According to the deposition parameters of Table No. 9, a layer of titanium nitride was deposited upon several thermal oxide substrates using a reaction chamber with unheated walls and a gas mixture of H$_2$/N$_2$. After the deposition of the films, the reaction chamber was inspected and there was no evidence of a yellow adduct found. None of the wafers of Table No. 9 were annealed with an RF NH$_3$ anneal.

Parameters for Adduct Test of Table No. 9

TiCl$_4$ (sccm) 10
N$_2$ (sccm) 500
H$_2$ (sccm) 500
RF Power (watts) 250 @ 450 KHz
Reaction Chamber Pressure (Torr) 1
Susceptor Rotation rate (rpm) 100
Substrate Temp. (°C.) 450
Deposition time (sec) 95
Susceptor Temperature (°C.) approximately 520

In Table 10, the flow of H$_2$ was increased to 5,000 sccm for wafers 1–4 and to 3,750 sccm for wafers 5–9. The deposition pressure was increased to 5 Torr. For wafers 5–9, a flow of 0.5 standard liters per minute (slm) of Argon was utilized with the H$_2$ as a diluent. In Table 10, wafers 1–2 and 5–6 were silicon, while wafers 3–4 and 7–9 were thermal oxide.

TABLE NO. 9

| Results and Additional Parameters | WAFER NO. | | | | | | | | | |
|---|---|---|---|---|---|---|---|---|---|---|
| | 1 | 2 | 3 | 4 | 5 | 6 | 7 | 8 | 9 | 10 |
| TiN layer thickness (Å) | 94 | 132 | 127 | 143 | 143 | 160 | 162 | 162 | 195 | 204 |
| Deposition Rate (Å/min) | 58 | 83 | 80 | 90 | 90 | 101 | 102 | 102 | 123 | 129 |
| Layer Resistivity ($\mu\Omega$-cm) | 2164 | 2218 | 1377 | 660 | 764 | 905 | 738 | 830 | 689 | 702 |
| Susceptor Temp (°C.) | 525 | 523 | 520 | 520 | 520 | 523 | 521 | 520 | 519 | 523 |

Further deposition runs were made utilizing the configuration of FIG. 2 wherein the plasma and reactant gas flows were adjusted, as well as the internal deposition pressure of the reaction space 44. For example, the deposition runs shown in FIG. 10 utilized a higher flow rate of H$_2$ and an increased deposition pressure from 1 Torr to 5 Torr. Further, Argon was mixed with the H$_2$ for some of the deposition runs.

Parameters for Table 10
  TiCl$_4$ (sccm) 10
  H$_2$ (sccm) 5,000 (wafers 1–4); 3,750 (wafers 5–9)
  Argon (slm) 0.5 (wafers 5–9)
  RF Power (watts) 250 @ 450 KHz
  Reaction Chamber Pressure (Torr) 5
  Susceptor Rotation rate (rpm) 100
  Deposition time (sec) 300 (600 for wafer 9)
  Substrate Temp. (°C.) 565
  Susceptor Temperature (°C.) approximately 650

Table 11 shows additional runs made with the increased H$_2$ flow and increased deposition pressure.

Deposition Parameters for Table No. 11

TiCl$_4$ (sccm) 10
  H$_2$ (sccm) 3,750
  Argon (slm) 0.5
  RF Power (watts) 250 @ 450 KHz
  Reaction Chamber Pressure (Torr) 5
  Susceptor Rotation Rate (rpm) 100
  Deposition time (sec) 300 (wafers 9–12 600 seconds)
  Substrate Temperature (°C.) 565
  Susceptor Temperature (°C.) 650

TABLE 10

| Results and Additional Parameters | WAFER NO. | | | | | | | | |
|---|---|---|---|---|---|---|---|---|---|
| | 1 | 2 | 3 | 4 | 5 | 6 | 7 | 8 | 9 |
| TiN layer thickness (Å) | 798 | 1076 | 43.4 | 89.5 | 912.2 | 1082 | 656.5 | 577.1 | 1302 |
| Deposition Rate (Å/min) | 159.0 | 215.0 | 9.1 | 17.9 | 182.5 | 216.5 | 131.3 | 115.4 | 130.2 |
| Layer Resistivity ($\mu\Omega$-cm) | 53.84 | 32.66 | 216.1 | 377.1 | 89.23 | 25.7 | 212.7 | 211.3 | 170.1 |

TABLE NO. 11

| Results and Additional | WAFER NO. | | | | | | | | | | | |
|---|---|---|---|---|---|---|---|---|---|---|---|---|
| Parameters | 1 | 2 | 3 | 4 | 5 | 6 | 7 | 8 | 9 | 10 | 11 | 12 |
| TiN layer thickness (Å) | 889.6 | 3994 | 510.3 | 458.6 | 466.2 | 385.6 | 347.8 | 263.3 | 792.5 | 948.8 | 749.7 | 714.4 |
| Deposition (Å/min) | 177.9 | 79.9 | 102.1 | 91.7 | 93.2 | 77.1 | 69.6 | 52.7 | 79.3 | 94.9 | 75.0 | 71.4 |
| Layer ($\mu\Omega$-cm) | 54.03 | 35.71 | 233.4 | 274.1 | 281.0 | 280.1 | 545.1 | 489.1 | 314.1 | 203.5 | — | — |

The change in deposition pressure from 1 Torr to 5 Torr produced a more stable and symmetric plasma. Additionally, the increased hydrogen flow with the addition of a small flow of argon increased the stability of the plasma flow as well as the plasma intensity. An argon flow of 0–10 slm is preferable. Wafers 1–2 were silicon, while wafers 3–10 were thermal oxide. Wafers 11 and 12 were borophospho-silicate glass, available from Thin Films, Inc. of Freemont, Calif. None of the wafers of either Table 10 or 11 were annealed with a $NH_3$ plasma anneal.

Figure 6:
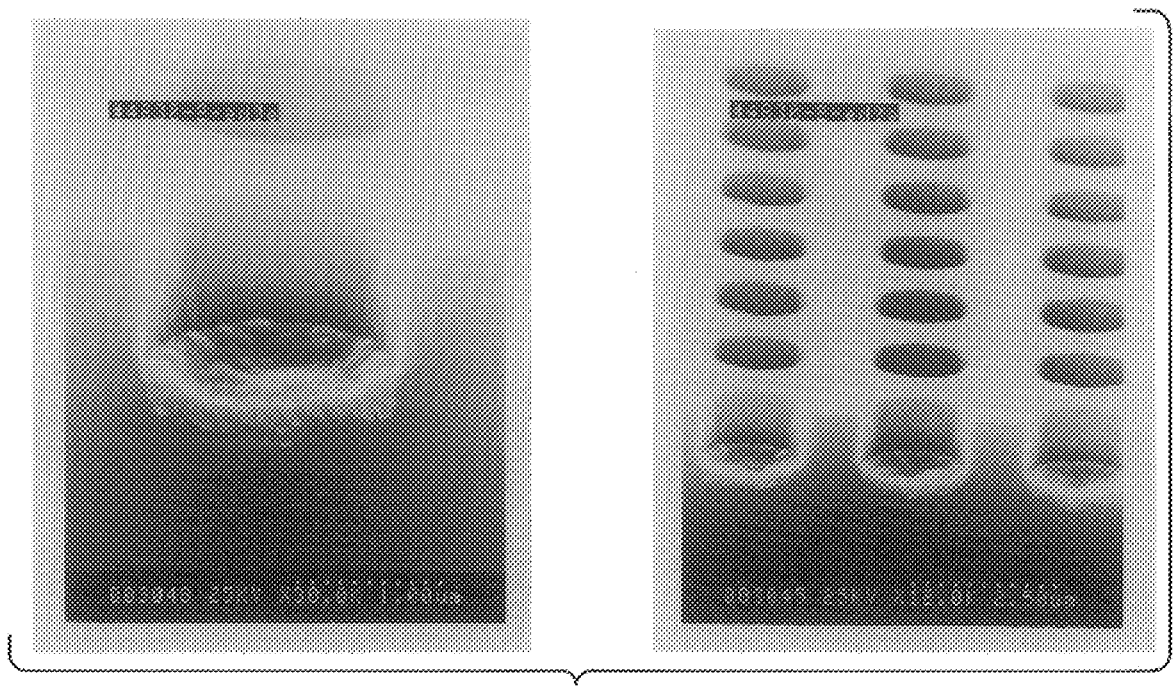
FIG. 6 is a photomicrograph showing selective deposition of titanium films onto vias patterned in a silicon oxide layer overlying a silicon substrate.

Wafers 11 and 12 had field oxide (silicon oxide) top layers, patterned with silicon contacts (i.e., vias through the field oxide to a lower silicon layer). Selective deposition was observed in wafer number 11 after processing in the manner described above. FIG. 6 shows deposition at the bottoms of silicon contacts (vias), but no deposition onto the oxide field. Selective deposition has been repeated and independently verified using the identified parameters. A selective deposition process can be used in place of multiple process steps to form vias. Selective deposition may be a result of different nucleation times for silicon and silicon oxide—nucleation occurs rapidly on silicon, but only after approximately 30 seconds on silicon oxide. Although the process applied to wafer 11 ran for longer than the normal 30 second nucleation time of silicon oxide, nucleation apparently did not occur over silicon oxide, possibly due to an instability in the plasma. High process pressures appear to be important for producing the selective effect.

Table 12 shows additional deposition runs at a susceptor temperature of 450° C.

Deposition Parameters for Table No. 12

$TiCl_4$ (sccm) 5

$H_2$ (sccm) 3,750

Argon (slm) 0.3

RF Power (watts) 250 @ 450 KHz

Reaction Chamber Pressure (Torr) 5

Susceptor Rotation Rate (rpm) 100

Deposition time (sec) 180

Substrate Temperature (°C.) approximately 400° C.

Susceptor Temperature (°C.) 450

TABLE NO. 12

| Results and Additional | WAFER NO. | | | | | | |
|---|---|---|---|---|---|---|---|
| Parameters | 1 | 2 | 3 | 4 | 5 | 6 | 7 |
| TiN layer thickness (Å) | 242 | 222 | 210 | 241 | 168 | 136 | 150 |

TABLE NO. 12-continued

| Results and Additional | WAFER NO. | | | | | | |
|---|---|---|---|---|---|---|---|
| Parameters | 1 | 2 | 3 | 4 | 5 | 6 | 7 |
| Deposition Rate (Å/min) | 80.7 | 74.0 | 70.0 | 80.3 | 56.0 | 45.3 | 50.0 |
| Layer Resistivity ($\mu\Omega$-cm) | 66.0 | 554.0 | 494.0 | 714.0 | 484.0 | 0.1 | 0.1 |

Wafers 1–4 were silicon, wafer 5 was thermal oxide while wafers 6 and 7 were an aluminum alloy containing aluminum silicon and copper. Runs 6 and 7 of Table 12 illustrate the viability of depositing a titanium-containing film on aluminum using the present invention. The deposition runs of Table 12 utilized a lower flow of reactant gas than the runs of Table 11, i.e., 5 sccm of $TiCl_4$.

Good adhesion between the aluminum and titanium layers was obtained by minimizing the corrosion of the aluminum layer. Corrosion is largely a result of exposure of the aluminum layer to chlorine ions ($Cl^-$) released from titanium tetrachloride ($TiCl_4$) during deposition. By reducing the flow rate of titanium tetrachloride, the corrosion of the aluminum layer is reduced and adhesion is improved. Reduced titanium tetrachloride flow also reduces the deposition rate, allowing dissociated titanium atoms additional time to locate stable sites in the underlying aluminum layer. This additional time is particularly needed due to the low thermal energy and reduced thermal motion of the titanium atoms at reduced process temperatures.

The deposition runs of Table 13 were made at further reduced $TiCl_4$ flow rates. All of the wafers of Table 13 were thermal oxide. None of the wafers of Table 12 or 13 were annealed with an $NH_3$ RF anneal.

Deposition Parameters for Table No. 13

$TiCl_4$ (sccm) wafers 1–2, 4 sccm; 3–4, 3 sccm; 5–6, 2 sccm; and wafer 7 at 1 sccm $H_2$ (sccm) 3,750

RF Power (watts) 250 @ 450 KHz

Reaction Chamber Pressure (Torr) 5

Susceptor Rotation Rate (rpm) 100

Deposition time (sec) 300 (wafers 1 and 2 at 180 and 240, respectively)

Substrate Temperature (°C.) approximately 400° C.

Susceptor Temperature (°C.) 450

TABLE NO. 13

| Results and Additional Parameters | WAFER NO. | | | | | | |
|---|---|---|---|---|---|---|---|
| | 1 | 2 | 3 | 4 | 5 | 6 | 7 |
| TiN layer thickness (Å) | 89 | 132 | 158 | 149 | 158 | 166 | 407 |
| Deposition Rate (Å/min) | 30 | 33 | 32 | 32 | 32 | 33 | 21 |
| Layer Resistivity ($\mu\Omega$-cm) | 259 | 239 | 199 | 199 | 190 | 208 | 482 |

Discussion of Results from Deposition Runs

Titanium films have ben deposited utilizing the parameters and apparatuses discussed above at rates ranging from 30 Å/min. measured by mass gain and by wave dispersive X-ray fluorescence (WDXRF). It has been found that the deposition rate is directly proportional to the deposition temperature and to the $TiCl_4$ partial pressure. Film resistivity increases from 120 to 150 $\mu\Omega$-cm as the deposition temperature is decreased from 550° C. to 450° C. Titanium films deposited at 550° C. onto thermally grown oxide were analyzed by Rutherford Back Scatter Spectroscopy (RBS) and found to be elemental titanium. The only impurity that is detectable by RBS is oxygen. Auger Electron Spectroscopy (AES) depth profiling was performed to identify low level contamination. The AES profiles indicate a bulk chloride content of 0.1%. Chloride was also measured by WDXRF, which indicated a bulk concentration of 0.45%.

Films were also deposited at 550° C. onto non-deglazed silicon substrates. These films were analyzed by RBS and found to have formed a silicide during the deposition process. No post deposition anneal had been performed. The stoichiometry of the in-situ silicided titanium is $TiSi_2$ but 0.5% chloride was detected. AES depth profiling confirmed the stoichiometry of the in-situ silicide, as well as the bulk chlorine content of 0.5%. The AES profiles indicate a low level of oxygen in the silicide, but there is no evidence of an oxygen peak at the silicon/$TiSi_2$ interface. This indicates that the native oxide has been removed by the CVD-Ti process.

Titanium films were deposited at 550° C. onto patterned borophospho-silicate glass (BPSG) in order to observe film conformality. All contacts were 1 $\mu$m to 0.35 $\mu$m (aspect ratios varied from 1.0 to 2.9). The titanium films were found to be conformal for all aspect ratios. Film thicknesses of up to 1500 Å were deposited and cross sections were observed by a scanning electron microscope (SEM). There was no evidence of overhang formation at the contact openings. Overhang formation is a fundamental problem with line of sight deposition processes such as sputtering. This problem has been well documented for both conventional and collimated sputtering, and the conformal nature of the CVD-Ti process represents a significant advantage over sputtering technology.

A comparison of the electrical properties obtained with CVD-Ti and sputtered-Ti was made using the electrical test structures described above. Contact resistance measurements were made using Kelvin structures with contact sizes which varied from 0.35 $\mu$m to 0.60 $\mu$m. In order to deposit 100 Å of titanium at the bottoms of the 0.35 $\mu$m contacts, 900 Å of sputtered-Ti was deposited compared to 200 Å of CVD-Ti. The CVD-Ti and sputtered-Ti films provided equivalent contact resistance for all contact sizes. However, the smaller contacts had a much higher probe yield with the CVD-Ti contact layer. For 0.35 $\mu$m contacts the yield for the CVD-Ti contact layer was double that of the sputtered-Ti layer. The improvement in yield indicates that the CVD-Ti process provides more uniform and repeatable results over the surface of the wafer, and suggests that the process may overcome minor contact to contact variations that are created by the contact etch and contact cleaning processes. This assertion is supported by the AES results reported above which showed that no residual native oxide was detected at the silicon/$TiSi_2$ interface after CVD-Ti and in-situ silicidation.

A more severe comparison of the two contact layers was made using chains of 10,000 contacts. Again the results were similar for the larger contacts. However at 0.35 $\mu$m The CVD contact layer produced superior results. The CVD-Ti contact layer provides contact chain resistance values that are two orders of magnitude lower than those obtained with the sputtered-Ti layer. Furthermore, the probe yield for the CVD-TI layer was five times higher than that for the sputtered layer.

Leakage current measurements for CVD-Ti and sputtered-Ti were similar. This indicates that the in-situ silicidation provided by the CVD-Ti process does not cause junction damage. This is confirmed by SEM cross sections which were performed on the samples after completing the electrical measurements. The cross sections confirm that the silicide formed during the CVD-Ti process at the bottoms of the contacts is uniform.

In conclusion, titanium films have been deposited by chemical vapor deposition at temperatures of 450° C. to 550° C. The titanium is fully converted to $TiSi_2$ during the deposition process for depositions onto silicon surfaces. Depositions were conformal with no evidence of titanium overhangs at contact openings. Contact resistance and junction leakage measurements indicate that the CVD-Ti process provides equivalent electrical performance to sputtered-Ti for low aspect ratio features. For higher aspect ratio features the CVD-Ti process provides superior contact resistance and yield. The improvement in electrical performance is due to the conformal nature of the CVD-Ti, the removal of the residual native oxide from the contact bottom, and formation of a uniform $TiSi_2$ layer at the contact bottom.

Figure 3:
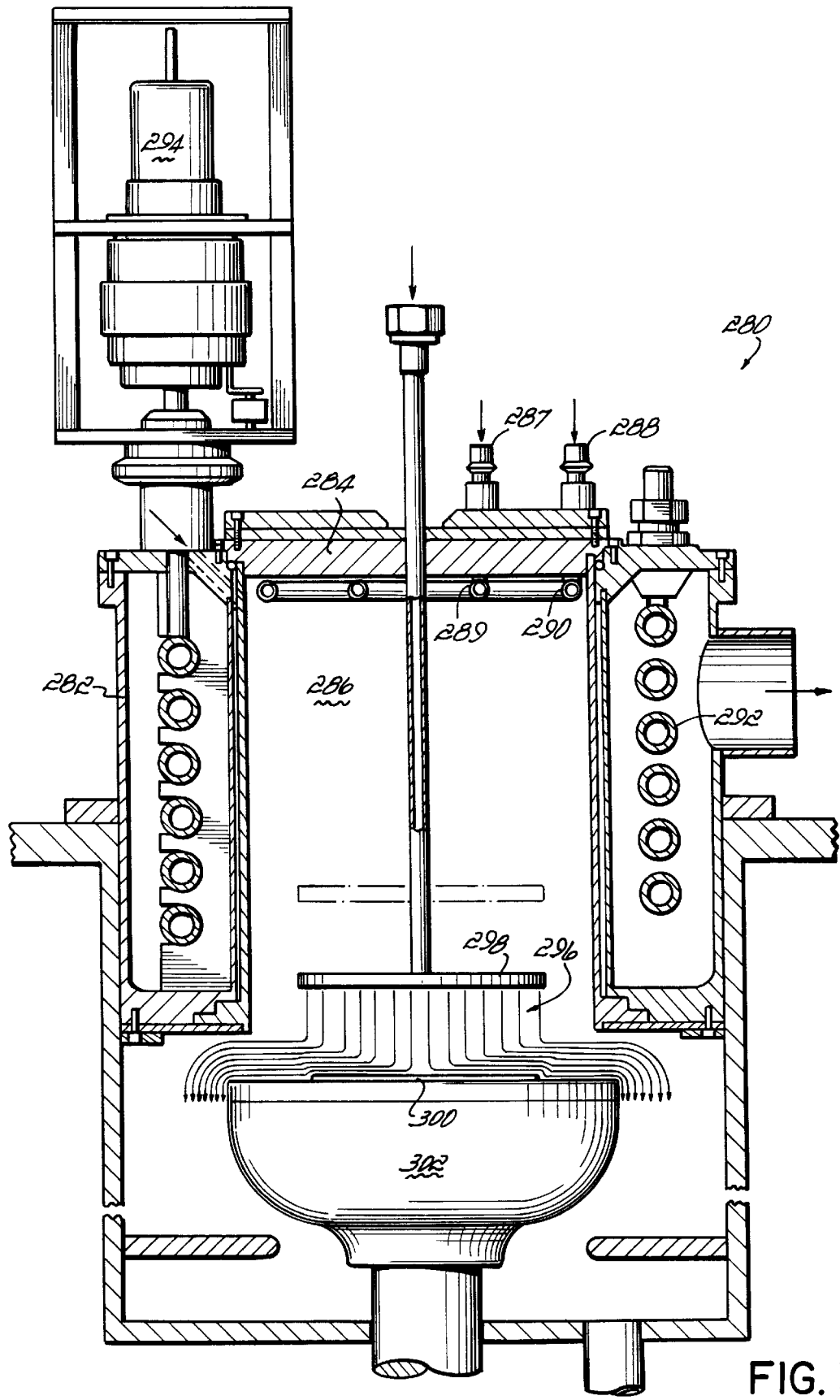
FIG. 3 is a side view an d partial cross-section of a second embodiment of an upstream plasma-enhanced deposition chamber using RF energy.

FIG. 3 shows another embodiment of a deposition chamber with an upstream RF plasma source which might be utilized to generate the necessary radicals for an upstream plasma low temperature PECVD process utilizing a rotating susceptor as discussed and disclosed hereinabove with respect to the upstream plasma generation utilized by the configuration of FIG. 1. Specifically, a deposition chamber 280 is attached to an RF plasma source 282. A suitable source is a commercially available RF source available from Prototech Research, Inc., of Tempe, Ariz. RF plasma source 282 includes a housing 284 which forms a plasma generating region 286 therein. The plasma gases to be excited, such as $H_2$, $N_2$, and/or $NH_3$ are introduced through gas input lines 287, 288 and gas rings 289, 290, respectively. Within region 286, the plasma gases are excited by an RF field generated by RF coil 292 which is connected to an RF source 294. RF energy of, for example, approximately 13.56 MHZ is delivered to the gases within region 286 to create a gas plasma containing free electrons, ions and radicals of the plasma gas. As the excited gases are drawn down the length of plasma-generating region 286, gas particles combine until preferably an abundance of radicals remain. The radicals are drawn down through a deposition region 296. The reactant gases, such as TiCl$_4$, are introduced into the deposition region 296 by a vertically adjustable gas showerhead 298, and the reactant gases and activated radicals are drawn down to substrate 300 by rotating susceptor 302 and combine to form a film layer on substrate 300. The substrate 300 heated as discussed above and similar pressures, susceptor rotation rates and gas flow rates for the examples discussed above might be utilized with the RF plasma source of FIG. 3. Accordingly, a film, such as a titanium-containing film, may be deposited at substantially lower temperatures than achieved with traditional thermal CVD processes.

While the present invention has been illustrated by the description of embodiments thereof, and while the embodiments have been described in considerable detail, it is not the intention of Applicants to restrict or in any way limit the scope of the appended claims to such detail. Additional advantages and modifications will readily appear to those skilled in the art. For example, the low temperature CVD technique of the present invention may be utilized to deposit other films besides the titanium-containing films discussed in extensive detail herein. Furthermore, activated radicals of gases other than H$_2$, N$_2$ and/or NH$_3$ might also be utilized to lower the deposition temperature. The invention in its broader aspects is therefore not limited to the specific details, representative apparatus and method, and illustrative example shown and described. Accordingly, departures may be made from such details without departing from the spirit or scope of Applicants' general inventive concept.

What is claimed is:

1. A method of depositing a film on a substrate located in a chemical vapor deposition reaction chamber by plasma enhanced chemical vapor deposition comprising:

providing a substrate inside a chemical vapor deposition reaction chamber;

supplying a first gas for introduction into said reaction chamber;

biasing a gas-dispersing showerhead in said chamber with an RF energy source so that the showerhead acts as an RF electrode with an associated RF field;

directing the first gas through a plurality of openings in said showerhead and through the RF field to excite said first gas to form activated radicals and ions of the first gas proximate the substrate;

supplying a second gas including a titanium tetrahalide constituent into said reaction chamber to mix with the first gas radicals and ions;

spacing the biased showerhead approximately one inch or less from the substrate inside said reaction chamber for providing a concentrated density of the activated radicals and ions to react with the second gas in a surface reaction on a surface of said substrate to deposit the film on said substrate surface.

2. The method of claim 1 further comprising:

rotating said substrate to draw the mixture of the first gas radicals and ions and the second gas to the substrate surface to promote uniform deposition of the film on the substrate surface.

3. The method of claim 1 further comprising:

passing said first gas through a cylinder coupled to the showerhead above the substrate to establish a first gas flow before passing the first gas through the showerhead, whereby to produce a uniform flow of radicals and ions to said substrate.

4. The method of claim 1 further comprising exciting said second gas with said showerhead and RF field such that the gas mixture contains first gas radicals and excited gas particles of the second gas.

5. The method of claim 1, wherein the first gas is selected from the group consisting of hydrogen, nitrogen, ammonia and mixtures thereof.

6. The method of claim 1, wherein a diluent gas is mixed with said first gas.

7. The method of claim 6, wherein said diluent gas includes argon.

8. The method of claim 2 further comprising rotating said substrate at a rate sufficient to produce a laminar flow of the first and second gas mixture over the substrate to reduce gas recirculations and recombinations of the activated radicals and ions.

9. The method of claim 1 further comprising heating the substrate between 200° C. and 800° C. during deposition of the film.

10. The method of claim 1 further comprising maintaining the pressure inside the reaction chamber between 0.5 and 15 Torr.

11. The method of claim 2 further comprising rotating the substrate at a rate between 0 and 50,000 rpm.

12. The method of claim 1 further comprising supplying the first gas at a rate between 50 and 50,000 sccm.

13. The method of claim 1 further comprising supplying the second gas at a rate between 1 and 20 sccm.

* * * * *

UNITED STATES PATENT AND TRADEMARK OFFICE
CERTIFICATE OF CORRECTION

PATENT NO. : 5,866,213

DATED : February 2, 1999

INVENTOR(S) : Robert F. Foster, Joseph T. Hillman and Rene E. LeBlanc

It is certified that error appears in the above-identified patent and that said Letters Patent is hereby corrected as shown below:

In Column 21, Table No. 5, line 66 under heading "8", delete "656"

and insert --650--.

In Column 22, line 26, delete "wafe" and insert --wafer--.

In Column 29, Table No. 13, line 3 under heading "7", delete "407 and insert --107--.

Signed and Sealed this

Twentieth Day of July, 1999

Attest:

Q. TODD DICKINSON

Attesting Officer

Acting Commissioner of Patents and Trademarks